US009870729B2

United States Patent
Saruhashi

(10) Patent No.: US 9,870,729 B2
(45) Date of Patent: Jan. 16, 2018

(54) CONTROL DEVICE AND DISPLAY DEVICE

(71) Applicant: Japan Display Inc., Tokyo (JP)

(72) Inventor: Yasuo Saruhashi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/277,429

(22) Filed: Sep. 27, 2016

(65) Prior Publication Data

US 2017/0103693 A1 Apr. 13, 2017

(30) Foreign Application Priority Data

Oct. 13, 2015 (JP) ................................. 2015-202288

(51) Int. Cl.
G09G 3/20 (2006.01)
G09G 3/3266 (2016.01)
H01L 27/32 (2006.01)

(52) U.S. Cl.
CPC ......... G09G 3/2003 (2013.01); G09G 3/3266 (2013.01); H01L 27/3213 (2013.01); G09G 2300/0809 (2013.01); G09G 2310/0291 (2013.01); G09G 2320/0646 (2013.01); G09G 2320/0666 (2013.01); G09G 2330/021 (2013.01); H01L 27/322 (2013.01); H01L 27/3244 (2013.01)

(58) Field of Classification Search
CPC ........... G09G 2330/021; G09G 3/3233; G09G 2310/08; G09G 2320/043
See application file for complete search history.

(56) References Cited

U.S. PATENT DOCUMENTS

2006/0146005 A1* 7/2006 Baba .................... G09G 3/3233
345/102
2007/0126672 A1* 6/2007 Tada .................... G09G 3/3233
345/77
2009/0096772 A1 4/2009 Kinoshita
2009/0174634 A1 7/2009 Kohno
2010/0315444 A1 12/2010 Mori et al.
(Continued)

FOREIGN PATENT DOCUMENTS

JP 2007-232751 A 9/2007
JP 2007-248653 A 9/2007
(Continued)

Primary Examiner — Olga Merkoulova
(74) Attorney, Agent, or Firm — Michael Best & Friedrich LLP

(57) ABSTRACT

A control device calculates output signal values to the respective pixels for each row based on pixel signal values. The control device includes a line integrating unit that calculates a line integrated value by totaling the pixel signal values for the respective pixels within a line pixel group, a frame integrating unit that calculates a frame integrated value by totaling the output signal values for the respective pixels of a former arranged pixel group for which the output signal values have already been calculated in the same display frame, a power consumption adjustment term determining unit that calculates a power consumption adjustment term based on a frame threshold that is a predetermined threshold for power consumption, a line integrated value, and a frame integrated value, and an output signal generating unit that calculates output signal values based on a pixel signal value and the power consumption adjustment term.

10 Claims, 13 Drawing Sheets

(56) References Cited

U.S. PATENT DOCUMENTS

2015/0138257 A1    5/2015   Imai et al.
2016/0035317 A1    2/2016   Imai et al.

FOREIGN PATENT DOCUMENTS

| JP | 2011-2520 A | 1/2011 |
| JP | 2015-99181 A | 5/2015 |
| JP | 2016-33607 A | 3/2016 |

\* cited by examiner

CONTROL DEVICE AND DISPLAY DEVICE

CROSS-REFERENCE TO RELATED APPLICATIONS

This application claims priority from Japanese Application No. 2015-202288, filed on Oct. 13, 2015, the contents of which are incorporated by reference herein in its entirety.

BACKGROUND

1. Technical Field

The present disclosure relates to a control device and a display device.

2. Description of the Related Art

In recent years, demand for display devices for mobile electronic apparatuses such as cellular phones and electronic paper has been increasing. In the display devices, one pixel includes a plurality of sub-pixels, the sub-pixels output light with different colors, and the display of the sub-pixels is switched on and off, thereby displaying various colors by one pixel. In such display devices, while display characteristics such as resolution and luminance have been increasing year by year, there has also been a demand for a reduction in power consumption.

Such display devices include a display device including a self-light-emitting display panel that lights self-light-emitting bodies such as an organic light-emitting diode (OLED) as disclosed in Japanese Patent Application Laid-open Publication No. 2011-2520, for example. In the self-light-emitting display device using the OLED or the like generally, higher luminance of a display screen gives increased power consumption. For this reason, some self-light-emitting display devices may include a circuit for controlling luminance in order to reduce power consumption. This circuit may control the luminance of a current frame based on the luminance value of a previous frame.

However, in the case that the luminance of the current frame is controlled based on the luminance value of the previous frame, when there is a significant difference in an image between the frames such as the case that the luminance significantly differs between the frames, the luminance of the current frame is unable to be appropriately adjusted. It may fail to appropriately reduce power consumption or degrade image quality.

For foregoing reason, there is a need to provide a control device and a display device that reduce the degradation of image quality while reducing power consumption.

SUMMARY

According to an aspect, a control device is for an image display panel which has pixels arranged in a two-dimensional matrix manner in a row direction and a column direction. The pixels display colors in accordance with lighting amounts of self-light-emitting bodies. The image display panel displays an image for each display frame. The control device calculates output signal value to the respective pixels for each row in the column direction based on pixel signal values for causing the pixels to display certain colors. The control device includes a line integrating unit that calculate a line integrated value by totaling the pixel signal values for the respective pixels within a line pixel group, the line pixel group including a plurality of pixels arranged in a row in the row direction; a frame integrating unit that calculates a frame integrated value by totaling the output signal values for the respective pixels of a former arranged pixel group, the former arranged pixel group including a plurality of pixels that are arranged in rows other than the line pixel group and for which the output signal values have already been calculated in the same display frame; a power consumption adjustment term determining unit that calculates a power consumption adjustment term common to the respective pixels within the line pixel group based on a frame threshold that is a predetermined threshold for power consumption in the display frame, the line integrated value, and the frame integrated value; and an output signal generating unit that calculates output signal values for the respective pixels of the line pixel group based on a pixel signal value to its own pixel within the line pixel group and the power consumption adjustment term.

According to another aspect, a display device includes an image display panel which has pixels arranged in a two-dimensional matrix manner in a row direction and a column direction. The pixels display colors in accordance with lighting amounts of self-light-emitting bodies. The image display panel displays an image for each display frame. The display device includes a controller that calculates output signal values to the respective pixels for each row in the column direction based on pixel signal values for causing the pixels to display certain colors. The controller includes a line integrating unit that calculate a line integrated value by totaling the pixel signal values for the respective pixels within a line pixel group, the line pixel group includes a plurality of pixels arranged in a row in the row direction; a frame integrating unit that calculates a frame integrated value by totaling the output signal values for the respective pixels of a former arranged pixel group, the former arranged pixel group includes a plurality of pixels that are arranged in rows other than the line pixel group and for which the output signal values have already been calculated in the same display frame; a power consumption adjustment term determining unit that calculates a power consumption adjustment term common to the respective pixels within the line pixel group based on a frame threshold that is a predetermined threshold for power consumption in the display frame, the line integrated value, and the frame integrated value; and an output signal generating unit that calculates output signal values for the respective pixels of the line pixel group based on a pixel signal value to its own pixel within the line pixel group and the power consumption adjustment term.

DETAILED DESCRIPTION

The following describes embodiments of the present invention with reference to the accompanying drawings. The disclosure is merely an example, and alterations as appropriate with the essence of the invention maintained, in which the alternations can be thought of by those skilled in the art easily, are naturally included in the scope of the present invention. In order to more clarify the description, the drawings may be represented schematically for the width, the thickness, the shape, or the like of parts compared with actual forms, which is merely an example and does not limit the interpretation of the present invention. In the present specification and drawings, components similar to ones described above about a drawing already described may be denoted by the same symbols, and a detailed description may be omitted as appropriate.

First Embodiment

Figure 1:
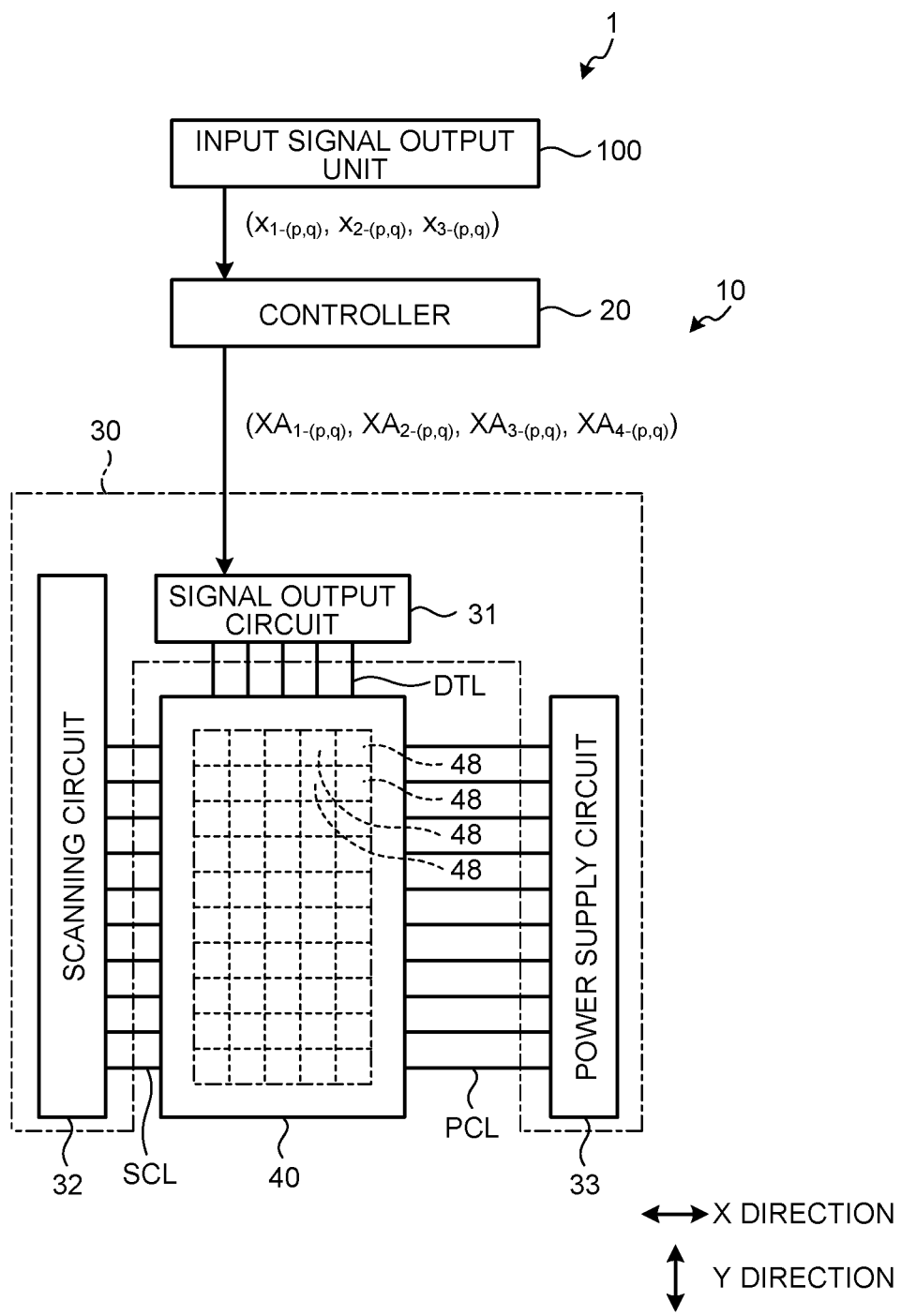
FIG. 1 is a block diagram of an example of a configuration of a display device according to a first embodiment.

FIG. 1 is a block diagram of an example of a configuration of a display device according to a first embodiment. As illustrated in FIG. 1, this display device 10 of the first embodiment includes a controller 20, an image display panel drive unit 30, and an image display panel 40. An input signal from an input signal output unit 100 is input to the controller 20, which sends a signal generated by adding certain data processing to the input signal to various parts of the display device 10. The image display panel drive unit 30 controls the drive of the image display panel 40 based on a signal from the controller 20. The image display panel 40 is a self-light-emitting image display panel that lights the self-light-emitting bodies of pixels to display an image based on a signal from the image display panel drive unit 30. The display device 10 and the input signal output unit 100 form an electronic apparatus 1 according to the first embodiment.

Configuration of Image Display Panel

Figure 2:
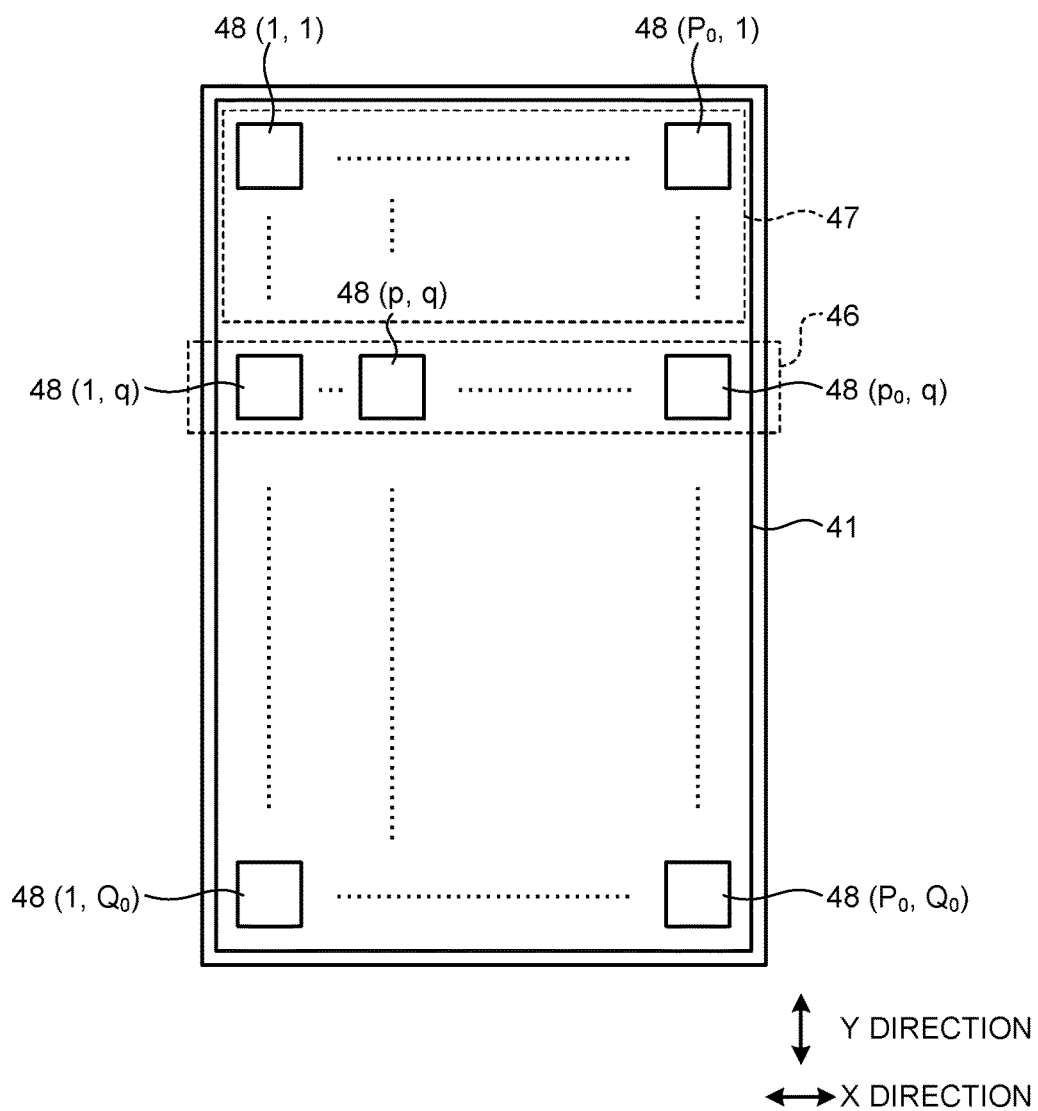
FIG. 2 is a diagram of a pixel arrangement of an image display panel according to the first embodiment.
Figure 3:
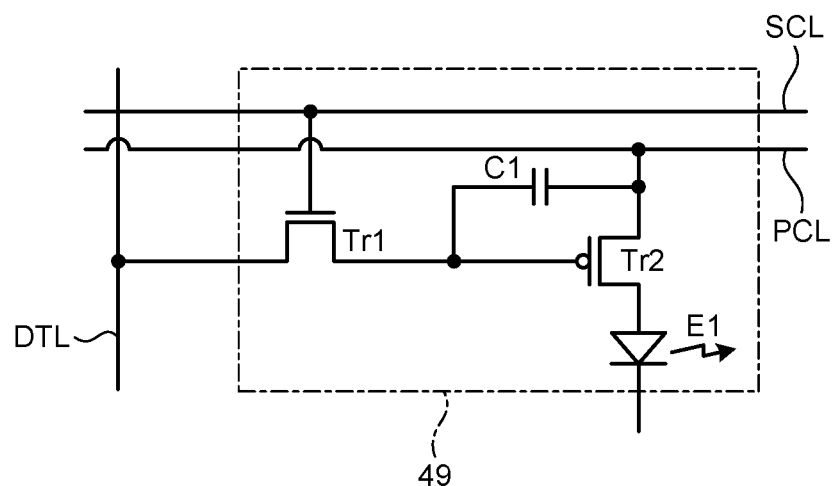
FIG. 3 is a diagram of a lighting drive circuit of a sub-pixel contained in a pixel of the image display panel according to the first embodiment.
Figure 4:
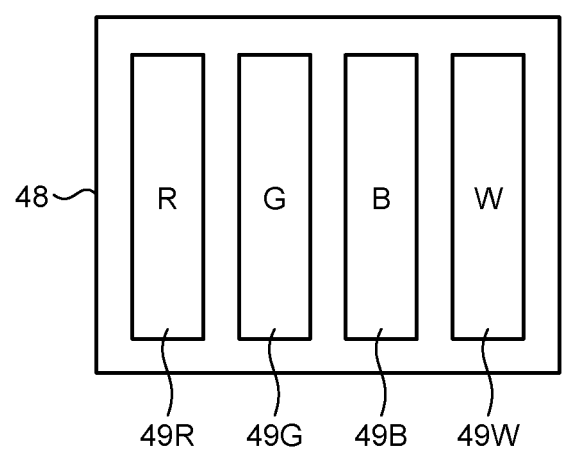
FIG. 4 is a diagram of an arrangement of sub-pixels of the image display panel according to the first embodiment.
Figure 5:
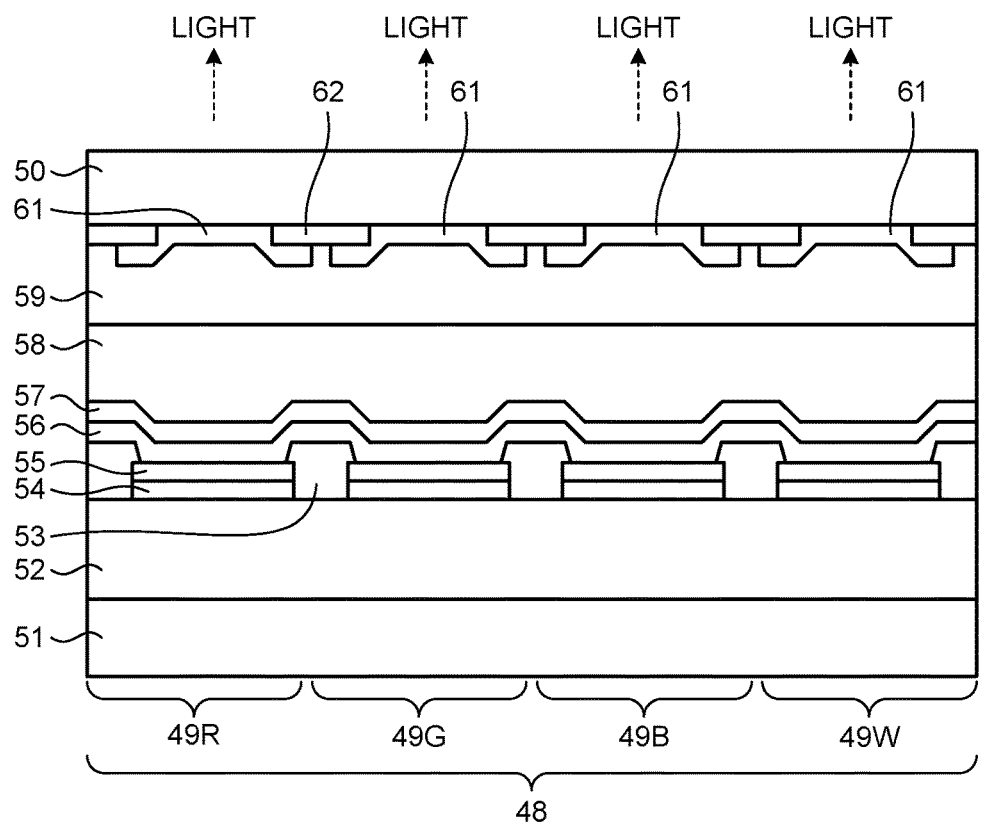
FIG. 5 is a diagram of a sectional structure of the image display panel according to the first embodiment.

The following first describes a configuration of the image display panel 40. FIG. 2 is a diagram of a pixel arrangement of the image display panel according to the first embodiment. FIG. 3 is a diagram of a lighting drive circuit of a sub-pixel contained in a pixel of the image display panel according to the first embodiment. FIG. 4 is a diagram of an arrangement of sub-pixels of the image display panel according to the first embodiment. FIG. 5 is a diagram of a sectional structure of the image display panel according to the first embodiment. The image display panel 40 arranges pixels 48 in a two-dimensional matrix manner in a row direction and a column direction in a display unit 41 and displays an image for each display frame. As illustrated in FIG. 2, the image display panel 40 arranges $P_0 \times Q_0$ ($P_0$ in an X direction and $Q_0$ in a Y direction) pixels 48 in a two-dimensional matrix manner in the display unit 41. In the present embodiment, the X direction is the row direction, whereas the Y direction is the column direction.

An X-direction pth (where $1 \le p \le P_0$), Y-direction qth (where $1 \le q \le Q_0$) pixel 48 is denoted by a pixel $48_{(p,q)}$. The image display panel 40 arranges a total of $Q_0$ rows of pixel rows in the Y direction in which each pixel row contains $P_0$ pixels 48 arranged in the X direction in the display unit 41. In the example in FIG. 2, a pixel row containing pixels from a pixel $48_{(1,1)}$ to a pixel $48_{(P0,1)}$ is arranged in the first row. A pixel row containing pixels from a pixel $48_{(1,q)}$ to a pixel $48_{(P0,q)}$ is arranged in the qth row. A pixel row containing pixels from a pixel $48_{(1,Q0)}$ to a pixel $48_{(P0,Q0)}$ is arranged in the $Q_0$th row.

As will be described in detail below, the controller 20 calculates output signal values to the respective pixels 48 for each pixel row along the Y direction from the first pixel row. In the following description, a pixel row for which the output signal values are to be calculated is defined as a line pixel group 46. All the pixel rows for which the output signal values have already been calculated in the same display frame as this line pixel group 46, which are other than the line pixel group 46, are defined as a former arranged pixel group 47. In other words, the former arranged pixel group 47 can be said to be an assembly of a plurality of pixels 48 that are arranged in the rows other than the line pixel group 46 and for which the output signal values have already been calculated in the same display frame. The controller 20 calculates the output signal values from the first pixel row in order, whereby the former arranged pixel group 47 can be said to be all the pixel rows which are previous rows than the line pixel group 46.

The pixel 48 contains a plurality of sub-pixels 49, and the lighting drive circuits of the sub-pixels 49 illustrated in FIG. 3 are arranged in a two-dimensional matrix manner. As illustrated in FIG. 3, the lighting drive circuit contains a transistor Tr1 for control, a transistor Tr2 for drive, and a capacitor C1 for charge retention. The gate of the transistor Tr1 for control is connected to a scan line SCL, the source thereof is connected to a signal line DTL, and the drain thereof is connected to the gate of the transistor Tr2 for drive. One end of the capacitor C1 for charge retention is connected to the gate of the transistor Tr2 for drive, and the other end thereof is connected to the source of the transistor Tr2 for drive. The source of the transistor Tr2 for drive is connected to a power supply line PCL, and the drain of the transistor Tr2 for drive is connected to the anode of the organic light-emitting diode E1 as a self-light-emitting body. The cathode of the organic light-emitting diode E1 is connected to a reference potential (a ground, for example), for example. Although FIG. 3 illustrates an example in which the transistor Tr1 for control is an n-type transistor, whereas the transistor Tr2 for drive is a p-type transistor, the polarities of the respective transistors are not limited thereto. The polarities of the transistor Tr1 for control and the transistor Tr2 for drive may be determined as needed.

As illustrated in FIG. 4, the pixel 48 has a first sub-pixel 49R, a second sub-pixel 49G, a third sub-pixel 49B, and a fourth sub-pixel 49W. The first sub-pixel 49R, the second sub-pixel 49G, the third sub-pixel 49B, and the fourth sub-pixel 49W are arranged in a stripe shape in one direction. The first sub-pixel 49R displays red as a primary color as a first color. The second sub-pixel 49G displays green as a primary color as a second color. The third sub-pixel 49B displays blue as a primary color as a third color. The fourth sub-pixel 49W displays white as a fourth color different from the first color, the second color, and the third color. The first color, the second color, the third color, and the fourth color are not limited to red, green, blue, and white, respectively, and any colors such as complementary colors can be selected therefor. In the following description, when there is no need to distinguish the first sub-pixel 49R, the second sub-pixel 49G, the third sub-pixel 49B, and the fourth sub-pixel 49W from each other, they are referred to as sub-pixels 49.

As illustrated in FIG. 5, the image display panel 40 includes a substrate 51, insulating layers 52 and 53, a reflective layer 54, lower electrodes 55, a self-light-emitting layer 56, an upper electrode 57, an insulating layer 58, an insulating layer 59, a color filter 61 as a color conversion layer, a black matrix 62 as a light-shielding layer, and a substrate 50. The substrate 51 is a semiconductor substrate such as silicone, a glass substrate, a resin substrate, or the like and forms or holds the lighting drive circuit and the like. The insulating layer 52 is a protective film that protects the lighting drive circuit and the like, and silicon oxide, silicon nitride, or the like can be used therefor. The lower electrodes 55, which are individually provided for the first sub-pixel 49R, the second sub-pixel 49G, the third sub-pixel 49B, and the fourth sub-pixel 49W, are conductors serving as the anode (the positive pole) of the organic light-emitting diode E1. The lower electrodes 55 are transparent electrodes formed of a translucent conductive material (a translucent conductive oxide) such as indium tin oxide (ITO). The insulating layer 53, which is called a bank, is an insulating layer that separates the first sub-pixel 49R, the second sub-pixel 49G, the third sub-pixel 49B, and the fourth sub-pixel 49W from each other. The reflective layer 54 is formed of a material having metallic luster to reflect light from the self-light-emitting layer 56 such as silver, aluminum, or gold. The self-light-emitting layer 56 contains organic materials and contains a hole injection layer, a hole transport layer, a light-emitting layer, an electron transport layer, and an electron injection layer, which are not illustrated.

Hole Transport Layer

A layer generating holes is preferably a layer containing an aromatic amine compound and a substance exhibiting electron acceptability to the compound, for example. The aromatic amine compound is a substance having an arylamine skeleton. Among the aromatic amine compounds, an aromatic amine compound containing triphenylamine in a skeleton and having a molecular weight of 400 or higher is particularly preferable. Among the aromatic amine compounds having triphenylamine in the skeleton, an aromatic amine compound containing a condensed aromatic ring such as a naphthyl group in the skeleton is particularly preferable. Using the aromatic amine compound containing triphenylamine and the condensed aromatic ring in the skeleton improves the heat resistance of a light-emitting element. Specific examples of the aromatic amine compound include 4,4'-bis[N-(1-naphthyl)-N-phenylamino]biphenyl (abbreviation: α-NPD), 4,4'-bis[N-(3-methylphenyl)-N-phenylamino]biphenyl (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-{4-(N,N-di-m-tolylamino)phenyl}-N-phenylamino]biphenyl (abbreviation: DNTPD), 1,3,5-tris[N,N-di(m-tolyl)amino]benzene (abbreviation: m-MTDAB), 4,4',4"-tris(N-carbazolyl)triphenylamine (abbreviation: TCTA), 2,3-bis(4-diphenylaminophenyl)quinoxaline (abbreviation: TPAQn), 2,2',3,3'-tetrakis(4-diphenylaminophenyl)-6,6'-bisquinoxaline (abbreviation: D-TriPhAQn), and 2,3-bis{4-[N-(1-naphthyl)-N-phenylamino]phenyl}-dibenzo[f,h]quinoxaline (abbreviation: NPADiBzQn). The substance exhibiting electron acceptability to the aromatic amine compound is not limited to particular substances, and examples thereof include molybdenum oxide, vanadium oxide, 7,7,8,8-tetracyanoquinodimethane (abbreviation: TCNQ), and 2,3,5,6-tetrafluoro-7,7,8,8-tetracyanoquinodimethane (abbreviation: F4-TCNQ).

Electron Injection Layer and Electron Transport Layer

An electron transport substance is not limited to particular substances, and examples thereof include metal complexes such as tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), bis(2-methyl-8-quinolinolato)-4-phenylphenolato-aluminum (abbreviation: BAlq), bis[2-(2-hydroxyphenyl)benzoxazolato]zinc (abbreviation: $Zn(BOX)_2$), and bis[2-(2-hydroxyphenyl)benzothiazolato]zinc (abbreviation: $Zn(BTZ)_2$), 2-(4-biphenyryl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenyryl)-1,2,4-triazole (abbreviation: TAZ), 3-(4-tert-butylphenyl)-4-(4-ethylphenyl)-5-(4-biphenyryl)-1,2,4-triazole (abbreviation: p-EtTAZ), bathophenanthroline (abbreviation: BPhen), and bathocuproin (abbreviation: BCP). A substance exhibiting electron donatability to the electron transport substance is not limited to particular substances, and examples thereof include alkali metal such as lithium and cesium, alkaline earth metals such as magnesium and calcium, and rare earth metals such as erbium and ytterbium. The substance exhibiting electron donatability to the electron transport substance may be a substance selected from alkali metal oxides and alkaline earth metal oxides such as lithium oxide ($Li_2O$), calcium oxide (CaO), sodium oxide ($Na_2O$), potassium oxide ($K_2O$), and magnesium oxide (MgO).

Light-Emitting Layer

When light emission with a color in the red range is desired to be obtained, for example, substances that exhibit light emission having an emission spectral peak between 600 nm and 680 nm can be used such as 4-dicyanomethylene-2-isopropyl-6-[2-(1,1,7,7-tetramethyljulolidin-9-yl)ethenyl]-4H-pyrane (abbreviation: DCJTI), 4-dicyanomethylene-2-methyl-6-[2-(1,1,7,7-tetramethyljulolidin-9-yl)ethenyl]-4H-pyrane (abbreviation: DCJT), 4-dicyanomethylene-2-tert-butyl-6-[2-(1,1,7,7-tetramethyljulolidin-9-yl)ethenyl]-4H-pyrane (abbreviation: DCJTB), periflanthene, and 2,5-dicyano-1,4-bis[2-(10-methoxy-1,1,7,7-tetramethyljulolidin-9-yl)ethenyl]benzene. When light emission with a color in the green range is desired to be obtained, substances that exhibit light emission having an emission spectral peak between 500 nm and 550 nm can be used such as N,N'-dimethylquinacridone (abbreviation: DMQd), coumarin 6, coumarin 545T, and tris(8-quinolinolato)aluminum (abbreviation: $Alq_3$). When light emission with a color in the blue range is desired to be obtained, substances that exhibit light emission having an emission spectral peak between 420 nm and 500 nm can be used such as 9,10-bis(2-naphthyl)-tert-butylanthracene (abbreviation: t-BuDNA), 9,9'-bianthryl, 9,10-diphenylanthracene (abbreviation: DPA), 9,10-bis(2-naphthyl)anthracene (abbreviation: DNA), bis(2-methyl-8-quinolinolato)-4-phenylphenolato-gallium (abbreviation: BGaq), and bis(2-methyl-8-quinolinolato)-4-phenylphenolato-aluminum (abbreviation: BAlq). In addition to the substances that emit fluorescence described above, examples of a light-emitting substance include substances that emit phosphorescence such as bis[2-(3,5-bis(trifluoromethyl)phenyl)pyridinato-N,C2'] iridium(III) picolinate (abbreviation: Ir(CF3ppy)$_2$(pic)), bis[2-(4,6-difluorophenyl)pyridinato-N,C2']iridium(III) acetylacetonato (abbreviation: FIr(acac)), and bis[2-(4,6-difluorophenyl)pyridinato-N—C2']iridium(III) picolinate (FIr(pic)), and tris(2-phenylpyridinato-N,C2')iridium (abbreviation: Ir(ppy)$_3$).

The upper electrode 57 is a translucent electrode formed of a translucent conductive material (a translucent conductive oxide) such as indium tin oxide (ITO). Although the present embodiment provides ITO as an example of the translucent conductive material, this is not limiting. For the translucent conductive material, conductive materials having different compositions such as indium zinc oxide (IZO) can be used. The upper electrode 57 turns into the cathode (the negative pole) of the organic light-emitting diode E1. The insulating layer 58 is a sealing layer sealing the upper electrode 57, and silicon oxide, silicon nitride, or the like can be used therefor. The insulating layer 59 is a flattening layer that reduces steps caused by the bank, and silicon oxide, silicon nitride, or the like can be used therefor. The substrate 50 is a translucent substrate that protects the entire image display panel 40, and a glass substrate can be used therefor, for example. Although FIG. 5 illustrates an example in which the lower electrodes 55 are the anode (the positive pole), whereas the upper electrode 57 is the cathode (the negative pole), this is not limiting. The lower electrodes 55 may be the cathode, whereas the upper electrode 57 may be the anode; in this case, the polarity of the transistor Tr2 for drive electrically connected to the lower electrodes 55 can be changed as appropriate, and the arrangement order of carrier injection layers (the hole injection layer and the electron injection layer), carrier transport layers (the hole transport layer and the electron transport layer), and the light-emitting layer can be changed as appropriate.

The image display panel 40 is a color display panel and arranges a color filter 61 that causes light of colors corresponding to the colors of the sub-pixels 49 among the light-emitting components of the self-light-emitting layer 56 to pass between the sub-pixels 49 and an image viewer. The image display panel 40 can emit light of colors corresponding to red, green, blue, and white. The color filter 61 is not necessarily arranged between the fourth sub-pixel 49W corresponding to white and the image viewer. The image display panel 40 can also emit the respective colors of the first sub-pixel 49R, the second sub-pixel 49G, the third sub-pixel 49B, and the fourth sub-pixel 49W without causing the light-emitting components of the self-light-emitting layer 56 to pass the color conversion layer such as the color filter 61. The image display panel 40 may provide a transparent resin layer in place of the color filter 61 for color adjustment for the fourth sub-pixel 49W, for example. By thus providing the transparent resin layer, the image display panel 40 can prevent a large step from occurring in the fourth sub-pixel 49W. For the fourth sub-pixel 49W, not the white sub-pixel, a sub-pixel of another high-luminance color such as yellow may be used. When the yellow sub-pixel is used as the fourth sub-pixel 49W, a white self-light-emitting layer 56 and a yellow color filer 61 may be arranged, or a self-light-emitting layer that emits yellow light may be used as the self-light-emitting layer 56.

Figure 6:
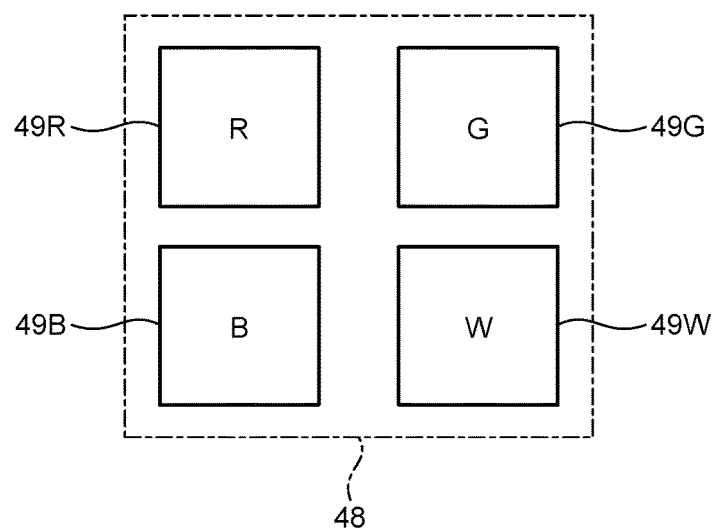
FIG. 6 is a diagram of another arrangement of the sub-pixels of the image display panel according to the first embodiment.

FIG. 6 is a diagram of another arrangement of the sub-pixels of the image display panel according to the first embodiment. In the image display panel 40, the pixels 48, each of which combines the sub-pixels 49 containing the first sub-pixel 49R, the second sub-pixel 49G, the third sub-pixel 49B, and the fourth sub-pixel 49W in two rows by two columns, are arranged in a matrix manner. The image display panel 40 may thus freely set the arrangement of the sub-pixels 49 within the pixel 48.

Configuration of Image Display Panel Drive Unit

The image display panel drive unit 30 illustrated in FIG. 1 is the control device of the image display panel 40 and includes a signal output circuit 31, a scanning circuit 32, and a power supply circuit 33. The signal output circuit 31 is electrically connected to the image display panel 40 via signal lines DTL. The signal output circuit 31 holds input image signals and successively outputs the image signals to the respective sub-pixels 49 of the image display panel 40. The scanning circuit 32 is electrically connected to the image display panel 40 via scan lines SCL. The scanning circuit 32 selects the sub-pixels 49 in the image display panel, controls the on and off states of a switching element (a thin film transistor (TFT), for example) for controlling the operation (the light emitting intensity) of the sub-pixels 49, and selects the respective pixel rows successively from the first row in the Y direction. The power supply circuit 33 supplies electric power to the organic light-emitting diodes E1 of the respective sub-pixels 49 via power supply lines PCL.

Configuration of Controller

The following describes the controller 20. The controller 20 calculates the output signal values to the respective pixels 48 for each row in the Y direction based on pixel signal values for causing the pixels 48 to display certain colors for the image display panel 40 that displays an image for each display frame. The controller 20 forms a control device. The controller 20 outputs output signals having the calculated output signal values to the image display panel drive unit 30.

Figure 7:
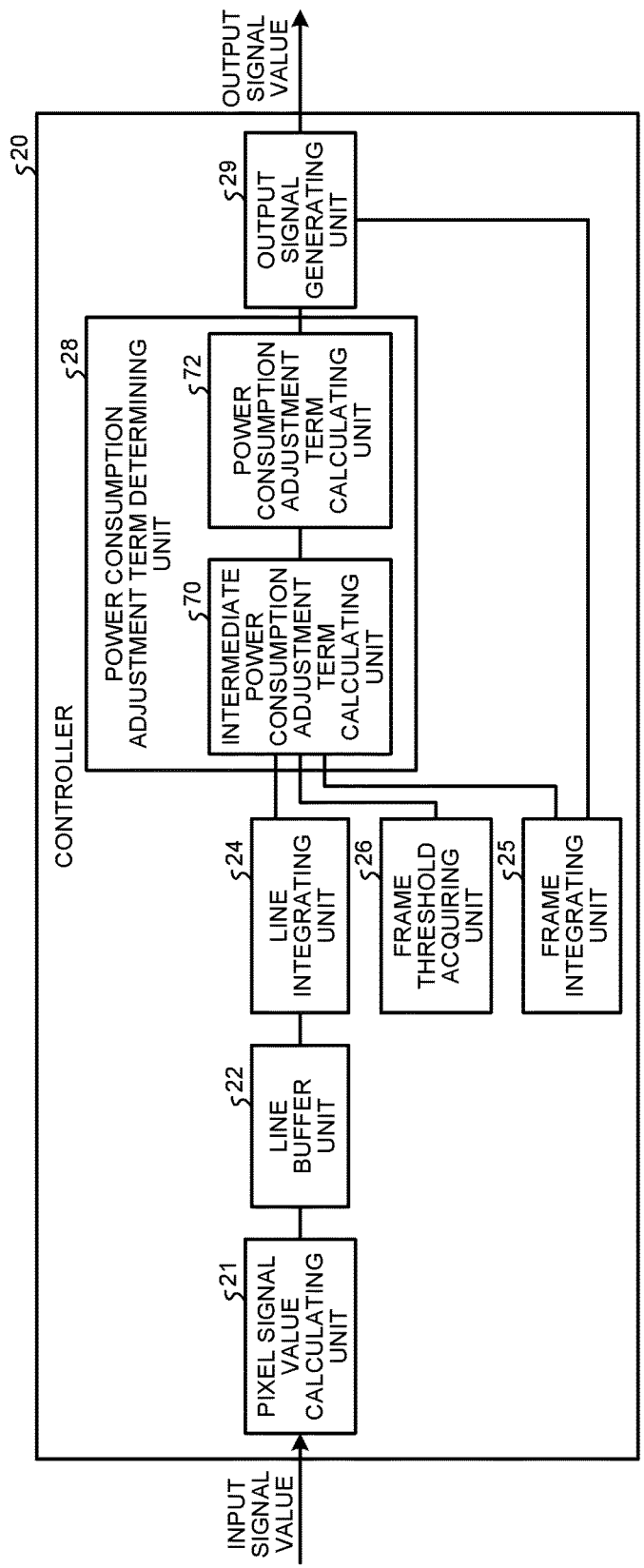
FIG. 7 is a block diagram of a configuration of a controller according to the first embodiment.

FIG. 7 is a block diagram of a configuration of the controller according to the first embodiment. As illustrated in FIG. 7, the controller 20 includes a pixel signal value calculating unit 21, a line buffer unit 22, a line integrating unit 24, a frame integrating unit 25, a frame threshold acquiring unit 26, a power consumption adjustment term determining unit 28, and an output signal generating unit 29. The pixel signal value calculating unit 21, the line buffer unit 22, the line integrating unit 24, the frame integrating unit 25, the frame threshold acquiring unit 26, the power consumption adjustment term determining unit 28, and the output signal generating unit 29 are pieces of software installed in the controller 20, which are not limited to the pieces of software and may be different pieces of hardware (circuits) so long as they exhibit functions described below.

The pixel signal value calculating unit 21 acquires the input signal value of the input signal that causes the colors of red (the first color), green (the second color), and blue (the third color) in a combined manner to be displayed. The pixel signal value calculating unit 21 converts this input signal value into a reproduced value (the pixel signal value) of an expanded color space (the HSV color space in the first embodiment) reproduced by red (the first color), green (the second color), blue (the third color), and white (the fourth color) and generates the reproduced value. The pixel signal value is a signal value for causing a pixel to display a certain color. The pixel signal value calculating unit 21 calculates the pixel signal value for each pixel 48, and more specifically, for each sub-pixel 49 contained in the pixel 48. Processing to calculate the pixel signal values by the pixel signal value calculating unit 21 will be described below. The expanded color space will also be described below. Although the expanded color space is the HSV color space in the first embodiment, this is not limiting; the expanded color space may be the XYZ color space, the YUV space, or other coordinate systems.

The line buffer unit 22 acquires the pixel signal values for the respective pixels 48 in the line pixel group 46 in order from the pixel signal value calculating unit 21. The line buffer unit 22 holds (stores) therein the pixel signal values of all the pixels 48 in the line pixel group 46. In other words, the line buffer unit 22 holds the pixel signal values for the respective pixels 48 of one pixel row for which the output signal values are to be calculated.

The line integrating unit 24 acquires the pixel signal values for all the pixels 48 in the line pixel group 46 from the line buffer unit 22. The line integrating unit 24 totals (adds up all) the pixel signal values for all the pixels 48 in the line pixel group 46 to calculate a line integrated value. A detailed method for calculating the line integrated value will be described below.

The frame integrating unit 25 acquires the output signal values for all the pixels 48 in the former arranged pixel group 47. The frame integrating unit 25 totals (adds up all) the output signal values for all the pixels 48 in the former arranged pixel group 47 to calculate a frame integrated value. In other words, the frame integrating unit 25 calculates the frame integrated value by totaling the output signal values for the pixels 48 that are all the pixels for which the output signal values have already been calculated in the same display frame as the line pixel group 46, and that are other than the line pixel group 46. The line pixel group 46 is for which the output signal values are to be calculated. A detailed method for calculating the frame integrated value will be described below.

The frame threshold acquiring unit 26 acquires information on a frame threshold. The frame threshold is a predetermined threshold for power consumption in one display frame. More specifically, the frame threshold is the upper limit of power consumption that occurs by lighting the respective pixels 48 in one display frame. As the pixels 48 are self-light-emitting bodies, the output signal values for the pixels 48 are proportional to the amount of power consumption caused by the lighting of the pixels 48. Consequently, the predetermined threshold for the power consumption in the one display frame can also be said to be a predetermined threshold for the total value of the output signal values of all the pixels 48 in one display frame. The frame threshold in the present embodiment is an upper limit for the total value of the output signal values of all the pixels in the display frame. However, the frame threshold may be an upper limit for power consumption in one display frame.

The frame threshold acquiring unit 26 may acquire information on the frame threshold set by an operator or acquires information on the frame threshold set in advance. The frame threshold may be changed by the operator. When power consumption is desired to be reduced, the frame threshold may be reduced when the operator changes the display mode of the display device 10 to a power-saving mode, for example.

The power consumption adjustment term determining unit 28 calculates a power consumption adjustment term common to the respective pixels within the line pixel group 46 based on the frame threshold, the line integrated value, and the frame integrated value. The power consumption adjustment term is a coefficient to adjust the amount of power consumption of the pixels 48 by adjusting the pixel signal values of the pixels 48. As illustrated in FIG. 7, the power consumption adjustment term determining unit 28 includes an intermediate power consumption adjustment term calculating unit 70 and a power consumption adjustment term calculating unit 72.

The intermediate power consumption adjustment term calculating unit 70 calculates an intermediate power consumption adjustment term based on the frame threshold, the frame integrated value, and the line integrated value. The intermediate power consumption adjustment term is a value for calculating the power consumption adjustment term. Details of method for calculating the intermediate power consumption adjustment term will be described below.

The power consumption adjustment term calculating unit 72 acquires the intermediate power consumption adjustment term from the intermediate power consumption adjustment term calculating unit 70. The power consumption adjustment term calculating unit 72 acquires an immediately previous power consumption adjustment term. The immediately previous power consumption adjustment term is a power consumption adjustment term in a pixel row for which the output signal values have been calculated immediately before. The power consumption adjustment term calculating unit 72 compares the immediately previous power consumption adjustment term and the intermediate power consumption adjustment term to calculate the power consumption adjustment term. A method for calculating the power consumption adjustment term will be described below.

The output signal generating unit 29 acquires the power consumption adjustment term from the power consumption adjustment term calculating unit 72. The output signal generating unit 29 acquires the pixel signal values of the respective pixels 48 within the line pixel group 46 from the pixel signal value calculating unit 21. The output signal generating unit 29 calculates the output signal values for the pixels 48 of the line pixel group 46 based on a pixel signal value to its own pixel 48 within the line pixel group 46 and the power consumption adjustment term. The output signal generating unit 29 outputs an output signal having the calculated output signal values to the image display panel drive unit 30. The output signal generating unit 29 outputs the calculated output signal values also to the frame integrating unit 25. The frame integrating unit 25 holds the output signal values acquired from the output signal generating unit 29. The frame integrating unit 25 updates the frame integrated value based on the output signal values acquired from the output signal generating unit 29 every time the line pixel group 46 for which the output signal values are calculated is switched to the next pixel row.

Processing of Controller

Processing to Calculate Pixel Signal Values

The following describes pieces of processing of the controller 20. The following first describes the processing to calculate the pixel signal values by the pixel signal value calculating unit 21. In the following description, an input signal value to the first sub-pixel 49R in the (p,q)th pixel 48$_{(p,q)}$ is defined as an input signal value $x_{1\text{-}(p,q)}$. An input signal value to the second sub-pixel 49G of the pixel 48$_{(p,q)}$ is defined as an input signal value $x_{2\text{-}(p,q)}$. An input signal value to the third sub-pixel 49B of the pixel $48_{(p,q)}$ is defined as an input signal value $x_{3-(p,q)}$. The pixel signal value calculating unit 21 executes extension processing on the input signal value $x_{1-(p,q)}$, the input signal value $x_{2-(p,q)}$, and the input signal value $x_{3-(p,q)}$ to generate a pixel signal value $X_{1-(p,q)}$ of the first sub-pixel for determining the display gradation of the first sub-pixel $49R_{(p,q)}$, a pixel signal value $X_{2-(p,q)}$ of the second sub-pixel for determining the display gradation of the second sub-pixel $49G_{(p,q)}$, a pixel signal value $X_{3-(p,q)}$ of the third sub-pixel for determining the display gradation of the third sub-pixel $49B_{(p,q)}$, and a pixel signal value $X_{4-(p,q)}$ of the fourth sub-pixel for determining the display gradation of the fourth sub-pixel $49W_{(p,q)}$.

Figure 8:
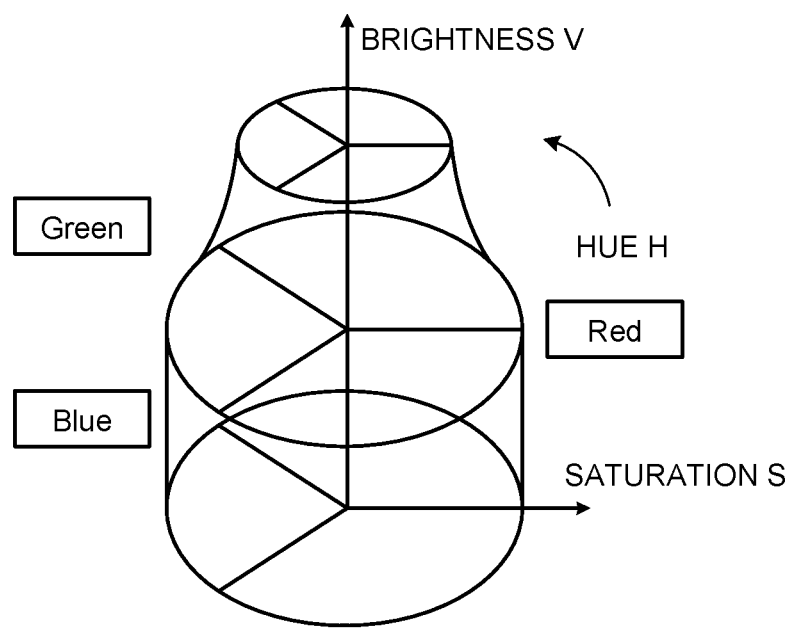
FIG. 8 is a conceptual diagram of an extended HSV (Hue-Saturation-Value, Value is also called Brightness) color space reproducible by the display device of the first embodiment.
Figure 9:
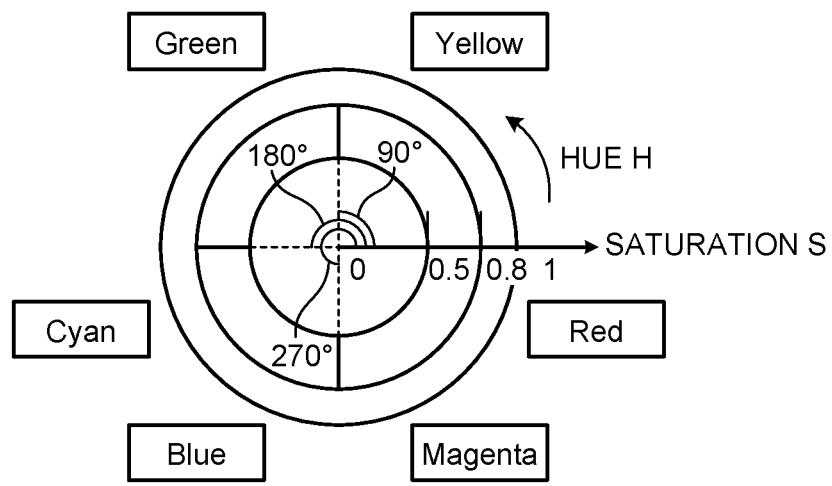
FIG. 9 is a conceptual diagram of a relation between the hue and the saturation of the extended HSV color space.

FIG. 8 is a conceptual diagram of an extended HSV (Hue-Saturation-Value, Value is also called Brightness) color space reproducible by the display device of the first embodiment. FIG. 9 is a conceptual diagram of a relation between the hue and the saturation of the extended HSV color space. The display device 10 includes the fourth sub-pixel 49W that outputs the fourth color (white) in the pixel 48, whereby the dynamic range of brightness in the reproduced color space (the HSV color space in the first embodiment) is extended as illustrated in FIG. 8. In other words, as illustrated in FIG. 8, the expanded color space reproduced by the display device 10 has a shape in which a solid in which a higher saturation gives a lower maximum value of brightness and a shape in a section containing a saturation axis and a brightness axis has substantially a trapezoidal shape having curved oblique sides is mounted on a cylindrical color space that can be displayed by the first sub-pixel 49R, the second sub-pixel 49G, and the third sub-pixel 49B. A maximum value Vmax (S) of the brightness with the saturation S in the expanded color space (the HSV color space in the first embodiment) expanded by adding the fourth color (white) as a variable is stored in the controller 20. In other words, the pixel signal value calculating unit 21 stores therein the value of the maximum value Vmax (S) of the brightness for each coordinate (value) of the saturation and the hue concerning the solid shape of the expanded color space illustrated in FIG. 8. Input signal data D2 contains the input signal values of the first sub-pixel 49R, the second sub-pixel 49G, and the third sub-pixel 49B, and the color space of the input signal data D2 has a cylindrical shape, that is, the same shape as the cylindrical part of the expanded color space. Although the expanded color space is the HSV color space in the first embodiment, this is not limiting; the expanded color space may be the XYZ color space, the YUV space, or other coordinate systems.

First, the pixel signal value calculating unit 21 calculates the saturation S and a value (also called brightness) V(S) in the respective pixels 48 based on the input signal values (the input signal value $x_{1-(p,q)}$, the input signal value $x_{2-(p,q)}$, and the input signal value $x_{3-(p,q)}$ of the respective pixels 48. The pixel signal value calculating unit 21 calculates extension coefficients α for the respective pixels 48. The extension coefficient α is set for each pixel 48.

The pixel signal value calculating unit 21 determines the saturation S and the brightness V(S) for the respective pixels 48. In the (p,q)th pixel generally, the saturation $S_{(p,q)}$ and the brightness (value) $V(S)_{(p,q)}$ in the cylindrical HSV color space can be determined by the following formula (1) and formula (2) based on the input signal value $x_{1-(p,q)}$ of the first sub-pixel, the input signal value $x_{2-(p,q)}$ of the second sub-pixel, and the input signal value $x_{3-(p,q)}$ of the third sub-pixel:

$$S_{(p,q)} = (Max_{(p,q)} - Min_{(p,q)})/Max_{(p,q)} \quad (1)$$

$$V(S)_{(p,q)} = Max_{(p,q)} \quad (2)$$

In the formulae, $Max_{(p,q)}$ is the maximum value of the input signal values of the three sub-pixels 49 ($x_{1-(p,q)}$, $x_{2-(p,q)}$, and $x_{3-(p,q)}$. $Min_{(p,q)}$ is the minimum value of the input signal values of the three sub-pixels 49 ($x_{1-(p,q)}$, $x_{2-(p,q)}$, and $x_{3-(p,q)}$.

Figure 10:
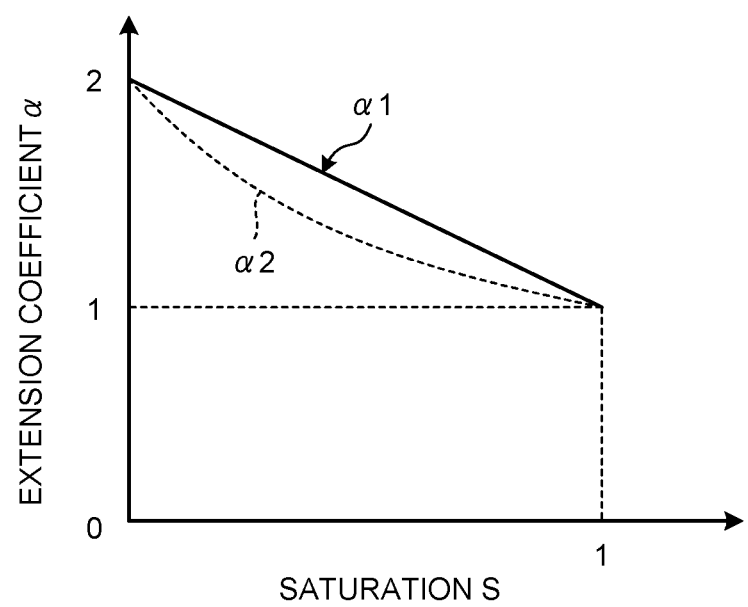
FIG. 10 is a graph of a relation between saturation and an extension coefficient in the present embodiment.

The pixel signal value calculating unit 21 calculates the extension coefficients α for the respective pixels 48. The extension coefficient α is set for each pixel 48. The pixel signal value calculating unit 21 calculates the extension coefficient α so that the value will change in accordance with the saturation S. More specifically, the pixel signal value calculating unit 21 calculates the extension coefficient α so that the value will become smaller as the saturation S increases. FIG. 10 is a graph of a relation between the saturation and the extension coefficient in the present embodiment. The horizontal axis of FIG. 10 is the saturation S, whereas the vertical axis thereof is the extension coefficient α. As indicated by the line segment α1 in FIG. 10, the pixel signal value calculating unit 21 sets the extension coefficient α to 2 when the saturation S is zero, reduces the extension coefficient α as the saturation S increases, and sets the extension coefficient α to 1 when the saturation S is 1. As indicated by the line segment α1 in FIG. 10, the extension coefficient α reduces linearly as the saturation increases. However, the pixel signal value calculating unit 21 is not limited to calculating the extension coefficient α in accordance with the line segment α1. The pixel signal value calculating unit 21 may calculate the extension coefficient α so as to be reduced as the saturation S of an input color increases. The pixel signal value calculating unit 21 may reduce the extension coefficient α quadratically as the saturation increases as indicated by the line segment α2 in FIG. 10, for example. The extension coefficient α when the saturation S is zero is not limited to 2 and can be freely set by a setting based on the luminance of the fourth sub-pixel 49W, for example. Further, the pixel signal value calculating unit 21 may set the extension coefficient α to be constant regardless of the saturation of the input color.

Next, the pixel signal value calculating unit 21 calculates the pixel signal value $X_{4-(p,q)}$ of the fourth sub-pixel based on at least the input signal of the first sub pixel (the signal value $x_{1-(p,q)}$, the input signal of the second sub pixel (the signal value $x_{2-(p,q)}$, and the input signal of the third sub pixel (the signal value $x_{3-(p,q)}$. More specifically, the pixel signal value calculating unit 21 determines the pixel signal value $X_{4-(p,q)}$ of the fourth sub-pixel based on the product of $Min_{(p,q)}$ and the extension coefficient α of its own pixel $48_{(p,q)}$). Specifically, the pixel signal value calculating unit 21 can determine the pixel signal value $X_{4-(p,q)}$ based on the following formula (3). Although the product of $Min_{(p,q)}$ and the extension coefficient α is divided by χ in the formula (3), this is not limiting:

$$X_{4-(p,q)} = Min_{(p,q)} \cdot \alpha / \chi \quad (3)$$

In the formula, χ is a constant depending on the display device 10. No color filter is arranged for the fourth sub-pixel 49W that displays white. When being irradiated with the same light source lighting amount, the fourth sub-pixel 49W that displays the fourth color is brighter than the first sub-pixel 49R that displays the first color, the second sub-pixel 49G that displays the second color, and the third sub-pixel 49B that displays the third color. The luminance of an assembly of the first sub-pixel 49R, the second sub-pixel 49G, and the third sub-pixel 49B contained in the pixel 48 or a group of pixels 48 when a signal having a value corresponding to the maximum signal value of the pixel signal values of the first sub-pixel 49R is input to the first sub-pixel 49R, a signal having a value corresponding to the maximum signal value of the pixel signal values of the second sub-pixel 49G is input to the second sub-pixel 49G, and a signal having a value corresponding to the maximum signal value of the pixel signal values of the third sub-pixel 49B is input to the third sub-pixel 49B is defined as $BN_{1-3}$. It is assumed that the luminance of the fourth sub-pixel 49W is defined as $BN_4$ when a signal having a value corresponding to the maximum signal value of the pixel signal values of the fourth sub-pixel 49W is input to the fourth sub-pixel 49W contained in the pixel 48 or a group of pixels 48. In other words, white with the maximum luminance is displayed by the assembly of the first sub-pixel 49R, the second sub-pixel 49G, and the third sub-pixel 49B, in which the luminance of this white is represented by $BN_{1-3}$. When $\chi$ is the constant depending on the display device 10, the constant $\chi$ is then represented by $\chi = BN_4/BN_{1-3}$.

Specifically, when it is assumed that an input signal having a display gradation value of 255 is input to the fourth sub-pixel 49W, the luminance $BN_4$ is 1.5 times the luminance of the white $BN_{1-3}$ when, as the input signal values having the following display gradation values, the input signal value $x_{1-(p,q)}=255$, the input signal value $x_{2-(p,q)}=255$, and the input signal value $x_{3-(p,q)}=255$ are input to the assembly of the first sub-pixel 49R, the second sub-pixel 49G, and the third sub-pixel 49B, for example. In other words, $\chi=1.5$ in the first embodiment.

Next, the pixel signal value calculating unit 21 calculates the pixel signal value $X_{1-(p,q)}$ of the first sub-pixel based on at least the input signal value $x_{1-(p,q)}$ of the first sub pixel and the extension coefficient $\alpha$ of its own pixel $48_{(p,q)}$. The pixel signal value calculating unit 21 calculates the pixel signal value $X_{2-(p,q)}$ of the second sub-pixel based on at least the input signal value $x_{2-(p,q)}$ of the second sub pixel and the extension coefficient $\alpha$ of its own pixel $48_{(p,q)}$. The pixel signal value calculating unit 21 calculates the pixel signal value $X_{3-(p,q)}$ of the third sub-pixel based on at least the input signal value $x_{3-(p,q)}$ of the third sub pixel and the extension coefficient $\alpha$ of its own pixel $48_{(p,q)}$.

Specifically, the pixel signal value calculating unit 21 calculates the pixel signal value of the first sub-pixel based on the input signal value of the first sub-pixel, the extension coefficient $\alpha$, and the pixel signal value of the fourth sub-pixel. The pixel signal value calculating unit 21 calculates the pixel signal value of the second sub-pixel based on the input signal value of the second sub-pixel, the extension coefficient $\alpha$, and the pixel signal value of the fourth sub-pixel. The pixel signal value calculating unit 21 calculates the pixel signal value of the third sub-pixel based on the input signal value of the third sub-pixel, the extension coefficient $\alpha$, and the pixel signal value of the fourth sub-pixel.

In other words, when $\chi$ is the constant depending on the display device, the pixel signal value calculating unit 21 determines the pixel signal value $X_{1-(p,q)}$ of the first sub-pixel, the pixel signal value $X_{2-(p,q)}$ of the second sub-pixel, and the pixel signal value $X_{3-(p,q)}$ of the third sub-pixel to the (p,q)th pixel (or a set of the first sub-pixel 49R, the second sub-pixel 49G, and the third sub-pixel 49B) from the following formulae (4), (5), and (6):

$$X_{1-(p,q)} = \alpha \cdot x_{1-(p,q)} - \chi \cdot X_{4-(p,q)} \quad (4)$$

$$X_{2-(p,q)} = \alpha \cdot x_{2-(p,q)} - \chi \cdot X_{4-(p,q)} \quad (5)$$

$$X_{3-(p,q)} = \alpha \cdot x_{3-(p,q)} - \chi \cdot X_{4-(p,q)} \quad (6)$$

The following describes the summary of how the signal values $X_{1-(p,q)}$, $X_{2-(p,q)}$, $X_{3-(p,q)}$, and $X_{4-(p,q)}$ are determined (extension processing). The next processing is performed so as to maintain the ratio among the luminance of the first primary color displayed by (the first sub-pixel 49R+the fourth sub-pixel 49W), the luminance of the second primary color displayed by (the second sub-pixel 49G+the fourth sub-pixel 49W), and the luminance of the third primary color displayed by (the third sub-pixel 49B+the fourth sub-pixel 49W). Further, the next processing is performed so as to hold (maintain) a tone. Still further, the next processing is performed so as to hold (maintain) a gradation-luminance characteristic (the gamma characteristic or the $\gamma$ characteristic). When all the input signal values are zero or small in any pixel 48 or a group of pixels 48, the extension coefficient $\alpha$ may be determined without including such a pixel 48 or a group of pixels 48.

First Process

First, the pixel signal value calculating unit 21 determines the saturation S and the brightness V(S) of the respective pixels 48 based on the input signal values (the input signal value $x_{1-(p,q)}$, the input signal value $x_{2-(p,q)}$, and the input signal value $x_{3-(p,q)}$ of the respective pixels 48. The pixel signal value calculating unit 21 then calculates the extension coefficient $\alpha$ for each pixel 48.

Second Process

Next, the pixel signal value calculating unit 21 determines the pixel signal value $X_{4-(p,q)}$ in the (p,q)th pixel 48 based on at least the input signal value $x_{1-(p,q)}$, the input signal value $x_{2-(p,q)}$, and the input signal value $x_{3-(p,q)}$. In the first embodiment, the pixel signal value calculating unit 21 determines the pixel signal value $X_{4-(p,q)}$ based on $Min_{(p,q)}$, the extension coefficient $\alpha$ of its own pixel $48_{(p,q)}$, and the constant $\chi$. More specifically, the pixel signal value calculating unit 21 determines the pixel signal value $X_{4-(p,q)}$, based on the formula (3) as described above.

Third Process

Subsequently, the pixel signal value calculating unit 21 determines the pixel signal value $X_{1-(p,q)}$ in the (p,q)th pixel 48 based on the input signal value $x_{1-(p,q)}$, the extension coefficient $\alpha$ of its own pixel $48_{(p,q)}$, and the pixel signal value $X_{4-(p,q)}$. The pixel signal value calculating unit 21 determines the pixel signal value $X_{2-(p,q)}$ in the (p,q)th pixel 48 based on the input signal value $x_{2-(p,q)}$, the extension coefficient $\alpha$ of its own pixel $48_{(p,q)}$, and the pixel signal value $X_{4-(p,q)}$. The pixel signal value calculating unit 21 determines the pixel signal value $X_{3-(p,q)}$ in the (p,q)th pixel 48 based on the input signal value $x_{3-(p,q)}$, the extension coefficient $\alpha$ of its own pixel $48_{(p,q)}$, and the pixel signal value $X_{4-(p,q)}$. Specifically, the pixel signal value calculating unit 21 determines the pixel signal value $X_{1-(p,q)}$, the pixel signal value $X_{2-(p,q)}$, and the pixel signal value $X_{3-(p,q)}$ in the (p,q)th pixel 48 based on the formulae (4) to (6).

The pixel signal value calculating unit 21 calculates the pixel signal values of the respective sub-pixels 49 in the respective pixels 48 as described above.

Line Integrated Value Calculation Processing

The following describes the processing to calculate the line integrated value by the line integrating unit 24. The following describes an example in which the output signal values are calculated for the qth pixel row. Consequently, the qth pixel row is the line pixel group 46, and the line pixel group 46 has $P_0$ pixels 48, that is, the pixel $48_{(1,q)}$, . . . the pixel $48_{(p,q)}$, . . . and the pixel $48_{(P0,q)}$.

The line buffer unit 22 acquires the pixel signal values for the respective pixels 48 in the line pixel group 46 for which the output signal values are to be calculated in order from the pixel signal value calculating unit 21. The line buffer unit 22 holds (stores) therein the pixel signal values of all the pixels 48 in the line pixel group 46. The line integrating unit 24 acquires the pixel signal values for all the pixels 48 in the line pixel group 46 from the line buffer unit 22. The line integrating unit 24 totals (adds up all) the pixel signal values for all the pixels 48 in the line pixel group 46 to calculate the line integrated value. In other words, the line integrating unit 24 adds up the pixel signal value of the first sub-pixel 49R, the pixel signal value of the second sub-pixel 49G, the pixel signal value of the third sub-pixel 49B, and the pixel signal value of the fourth sub-pixel 49W in the pixel 48 within the line pixel group 46 for all the pixels 48 of the line pixel group 46. The line integrating unit 24 determines the added-up value to be the line integrated value. Specifically, in the case that the line integrated value is L(q) when the qth pixel row is the line pixel group 46, the line integrating unit 24 calculates the line integrated value L(q) based on the following formula (7):

$$L(q) = \sum_{P=1}^{P_0} (X_{1-(P,q)} + X_{2-(P,q)} + X_{3-(P,q)} + X_{4-(P,q)}) \tag{7}$$

Frame Integrated Value Calculation Processing

The following describes the processing to calculate the frame integrated value by the frame integrating unit 25. The frame integrating unit 25 acquires the output signal values for all the pixels 48 in the former arranged pixel group 47. The frame integrating unit 25 acquires the output signal values from the output signal generating unit 29. The former arranged pixel group 47 is all the pixel rows for which the output signal values have already been calculated in the same display frame as the line pixel group 46 for which the output signal values are to be calculated, the pixel rows excluding the line pixel group 46. Consequently, the former arranged pixel group 47 in this description is pixel rows from the first row to the (q−1)th row.

The frame integrating unit 25 totals (adds up all) the output signal values for all the pixels 48 in the former arranged pixel group 47 to calculate the frame integrated value. In other words, the frame integrating unit 25 adds up the output signal value of the first sub-pixel 49R, the output signal value of the second sub-pixel 49G, the output signal value of the third sub-pixel 49B, and the output signal value of the fourth sub-pixel 49W in the pixel 48 within the former arranged pixel group 47 for all the pixels 48 of the former arranged pixel group 47. The frame integrating unit 25 determines the added-up value to be the frame integrated value. In the present embodiment, the frame integrating unit 25 adds up the frame integrated value calculated when the line pixel group 46 was the previous (the (q−1)th) pixel row (the total of the output signal values of the respective pixels 48 from the first row to the (q−2)th row), the output signal value of the first sub-pixel 49R, the output signal value of the second sub-pixel 49G, the output signal value of the third sub-pixel 49B, and the output signal value of the fourth sub-pixel 49W in all the pixels 48 within the (q−1)th pixel row to calculate the frame integrated value used when the qth pixel row is the line pixel group 46. Specifically, the case is considered that the frame integrated value is M(q) when the line pixel group 46 is the qth pixel row, and the frame integrated value is M(q−1) when the line pixel group 46 was the previous (the (q−1)th) pixel row. In the case, the frame integrating unit 25 calculates the frame integrated value M(q) based on the following formula (8):

$$M(q) = \tag{8}$$
$$M(q-1) + \sum_{p=1}^{P_0} (XA_{1-(p,q-1)} + XA_{2-(p,q-1)} + XA_{3-(p,q-1)} + XA_{4-(p,q-1)})$$

Intermediate Power Consumption Adjustment Term Calculation Processing

The following describes the processing to calculate the intermediate power consumption adjustment term by the intermediate power consumption adjustment term calculating unit 70. When the frame threshold is A, the intermediate power consumption adjustment term calculating unit 70 calculates an intermediate power consumption adjustment term $G_1(q)$ based on the line integrated value L(q), the frame integrated value M(q), and the frame threshold A. The intermediate power consumption adjustment term $G_1(q)$ is used when the line pixel group 46 is the qth pixel row Specifically, the intermediate power consumption adjustment term calculating unit 70 calculates a difference value U(q) that is a value obtained by subtracting the frame integrated value M(q) from the frame threshold A as in the following formula (9). The difference value U(q) can be said to be the allowance margin of the amount of power consumption (the magnitude of the output signal values) that the line pixel group 46 can consume.

$$U(q)=A-M(q) \tag{9}$$

The intermediate power consumption adjustment term calculating unit 70 calculates the intermediate power consumption adjustment term $G_1(q)$ so that the product of the line integrated value L(q) and the intermediate power consumption adjustment term $G_1(q)$ will not exceed the difference value U(q) (the allowance margin of the amount of power consumption). More specifically, the intermediate power consumption adjustment term calculating unit 70 calculates the total of the number of rows of the line pixel group 46 and the former arranged pixel group 47. In this example, the total of the number of rows of the line pixel group 46 and the former arranged pixel group 47 is q. The intermediate power consumption adjustment term calculating unit 70 calculates the intermediate power consumption adjustment term $G_1(q)$ so that the product of the line integrated value L(q) and the intermediate power consumption adjustment term $G_1(q)$ will not exceed a value obtained by dividing the difference value U(q) by the total of the number of rows (q) (the allowance margin of the amount of power consumption for each pixel row). Specifically, in the present embodiment, the intermediate power consumption adjustment term calculating unit 70 calculates the intermediate power consumption adjustment term $G_1(q)$ based on the following formula (10):

$$G_1(q)=U(q)/(q \cdot L(q)) \tag{10}$$

Further, when the calculated value of the intermediate power consumption adjustment term $G_1(q)$ is larger than 1, the intermediate power consumption adjustment term calculating unit 70 sets the value of the intermediate power consumption adjustment term $G_1(q)$ to 1. In other words, the intermediate power consumption adjustment term calculating unit 70 sets the intermediate power consumption adjustment term $G_1(q)$ so that the value of the product of the intermediate power consumption adjustment term $G_1(q)$ and the pixel signal value will not exceed the value of the pixel signal value.

However, the method for calculating the intermediate power consumption adjustment term $G_1(q)$ by the intermediate power consumption adjustment term calculating unit 70 is not limited to the formula (10). The intermediate power consumption adjustment term calculating unit 70 may use the total number of rows ($Q_0$) of all the pixel rows in one display frame instead of the total of the number of rows (q) in formula (10), for example. The intermediate power consumption adjustment term $G_1(q)$ may be calculated so that the product of the line integrated value $L(q)$ and the intermediate power consumption adjustment term $G_1(q)$ will not exceed the difference value $U(q)$. When the frame threshold A is the threshold of the amount of power consumption and the line integrated value $L(q)$ and the frame integrated value $M(q)$ are values associated with the pixel signal value, calculation may be performed using an adjustment coefficient of the output signal value and the power consumption, for example. The intermediate power consumption adjustment term calculating unit 70 may calculate a corrected frame threshold A1 converted into the output signal value based on the adjustment coefficient of the output signal value and power consumption and the frame threshold A. The intermediate power consumption adjustment term calculating unit 70 may use the corrected frame threshold A1 instead of the frame threshold A in the formula (9), for example. Alternatively, by using the adjustment coefficient of the output signal value and the power consumption for the line integrated value $L(q)$ and the frame integrated value $M(q)$, the line integrated value $L(q)$ and the frame integrated value $M(q)$ may be regarded as values corresponding to the power consumption.

Power Consumption Adjustment Term Calculation Processing

The following describes the processing to calculate a power consumption adjustment term $G_2(q)$ by the power consumption adjustment term calculating unit 72. The power consumption adjustment term calculating unit 72 acquires the intermediate power consumption adjustment term $G_1(q)$ from the intermediate power consumption adjustment term calculating unit 70. The power consumption adjustment term calculating unit 72 acquires an immediately previous power consumption adjustment term $G_2(q-1)$. The immediately previous power consumption adjustment term $G_2(q-1)$ is the power consumption adjustment term in the pixel row for which the output signal values have been calculated immediately before(the (q−1)th pixel row in this example). The power consumption adjustment term calculating unit 72 compares the immediately previous power consumption adjustment term $G_2(q-1)$ and the intermediate power consumption adjustment term $G_1(q)$ to calculate the power consumption adjustment term $G_2(q)$. The power consumption adjustment term calculating unit 72 holds the power consumption adjustment term, as the immediately previous power consumption adjustment term, calculated when the (q−1)th pixel row is taken as the line pixel group 46. The power consumption adjustment term calculating unit 72 uses the immediately previous power consumption adjustment term when calculating the power consumption adjustment term with the qth pixel row as the line pixel group 46.

If the intermediate power consumption adjustment term $G_1(q)$ is smaller than the immediately previous power consumption adjustment term $G_2(q-1)$, the power consumption adjustment term calculating unit 72 calculates the power consumption adjustment term $G_2(q)$ based on the immediately previous power consumption adjustment term $G_2(q-1)$ and a predetermined value B. Specifically, if the intermediate power consumption adjustment term $G_1(q)$ is smaller than the immediately previous power consumption adjustment term $G_2(q-1)$, the power consumption adjustment term calculating unit 72 determines a value obtained by subtracting the predetermined value B from the immediately previous power consumption adjustment term $G_2(q-1)$ to be the power consumption adjustment term $G_2(q)$. If the intermediate power consumption adjustment term $G_1(q)$ is a value of the immediately previous power consumption adjustment term $G_2(q-1)$ or larger, the power consumption adjustment term calculating unit 72 makes the power consumption adjustment term $G_2(q)$ the same value as the immediately previous power consumption adjustment term $G_2(q-1)$.

Specifically, if the intermediate power consumption adjustment term $G_1(q)$ is smaller than the immediately previous power consumption adjustment term $G_2(q-1)$, the power consumption adjustment term calculating unit 72 calculates the power consumption adjustment term $G_2(q)$ by the following formula (11). If the intermediate power consumption adjustment term $G_1(q)$ is a value of the immediately previous power consumption adjustment term $G_2(q-1)$ or larger, the power consumption adjustment term calculating unit 72 calculates the power consumption adjustment term $G_2(q)$ by the following formula (12). The first pixel row does not have the immediately previous power consumption adjustment term $G_2(q-1)$. For the first pixel row, the power consumption adjustment term calculating unit 72 regards the intermediate power consumption adjustment term $G_1(q)$ as the power consumption adjustment term $G_2(q)$ as it is.

$$G_2(q)=G_2(q-1)-B \text{ (where } G_1(q)<G_2(q-1)) \tag{11}$$

$$G_2(q)=G_2(q-1) \text{ (where } G_1(q) \geq G_2(q-1)) \tag{12}$$

The predetermined value B is a positive value set in advance. In other words, the power consumption adjustment term $G_2(q)$ is never a value larger than the immediately previous power consumption adjustment term $G_2(q-1)$ and takes a value of 0 to 1. Although the predetermined value B is a value set in advance, it may be changed by the operator.

More specifically, the predetermined value B is a coefficient for, when the power consumption adjustment term $G_2(q)$ is reduced from the immediately previous power consumption adjustment term $G_2(q-1)$ of the previous row, making the reduction amount a constant value. The predetermined value B is a value set based on the total number of rows ($Q_0$) of all the pixel rows in one display frame. In the present embodiment, the predetermined value B is set based on the inverse of the total number of rows ($Q_0$) of all the pixel rows in one display frame. Specifically, the predetermined value B is set as the following formula (13):

$$B=C/Q_0 \tag{13}$$

In the formula (13), C is a predetermined constant of larger than 0 and smaller than 1.

As described above, the power consumption adjustment term calculating unit 72 calculates the power consumption adjustment term $G_2(q)$ common to the respective pixels 48 within the line pixel group 46. However, the processing to calculate the power consumption adjustment term $G_2(q)$ is not limited to the processing described above. The power consumption adjustment term calculating unit 72 may regard the intermediate power consumption adjustment term $G_1(q)$ as the power consumption adjustment term $G_2(q)$ as it is if the value obtained by subtracting the intermediate power consumption adjustment term $G_1(q)$ from the immediately previous power consumption adjustment term $G_2(q-1)$ is the predetermined value B or less. The power consumption adjustment term calculating unit 72 may calculate the power consumption adjustment term $G_2(q)$ in accordance with the formula (11) if the value obtained by subtracting the intermediate power consumption adjustment term $G_1(q)$ from the immediately previous power consumption adjustment term $G_2(q-1)$ is larger than the predetermined value B, for example.

The power consumption adjustment term calculating unit 72 may regard the intermediate power consumption adjustment term $G_1(q)$ as the power consumption adjustment term $G_2(q)$ as it is if the intermediate power consumption adjustment term $G_1(q)$ is smaller than the immediately previous power consumption adjustment term $G_2(q-1)$ regardless of the value obtained by subtracting the intermediate power consumption adjustment term $G_1(q)$ from the immediately previous power consumption adjustment term $G_2(q-1)$, for example.

The power consumption adjustment term calculating unit 72 may always regard the intermediate power consumption adjustment term $G_1(q)$ as the power consumption adjustment term $G_2(q)$ as it is without performing the comparison of the intermediate power consumption adjustment term $G_1(q)$ and the immediately previous power consumption adjustment term $G_2(q-1)$, for example. In this case, the intermediate power consumption adjustment term $G_1(q)$ is a value of 1 or less, and the power consumption adjustment term $G_2(q)$ is also a value of 1 or less.

If the intermediate power consumption adjustment term $G_1(q)$ is smaller than the immediately previous power consumption adjustment term $G_2(q-1)$, the power consumption adjustment term calculating unit 72 may calculate the power consumption adjustment term $G_2(q)$ based on the following formula (14) in place of the formula (11), for example:

$$G_2(q)=G_2(q-1)-T\cdot\{G_1(q-1)-G_1(q)\} \text{ (where } G_1(q)<G_2(q-1)) \tag{14}$$

In the formula, T is a predetermined coefficient having a positive value set in advance.

Output Signal Value Calculation Processing

The following describes processing to calculate an output signal by the output signal generating unit 29. The output signal generating unit 29 calculates an output signal value for the pixel $48_{(p,q)}$ based on the pixel signal values to the pixel $48_{(p,q)}$ within the line pixel group 46 and the power consumption adjustment term $G_2(q)$.

In the following description, an output signal value of the first sub-pixel 49R in the (p,q)th pixel $48_{(p,q)}$ is defined as an output signal value $XA_{1-(p,q)}$. An output signal value to the second sub-pixel 49G of the pixel $48_{(p,q)}$ is defined as an output signal value $XA_{2-(p,q)}$. An output signal value to the third sub-pixel 49B of the pixel $48_{(p,q)}$ is defined as an output signal value $XA_{3-(p,q)}$. An output signal value to the fourth sub-pixel 49W of the pixel $48_{(p,q)}$ is defined as an output signal value $XA_{4-(p,q)}$. The output signal generating unit 29 calculates the output signal value $XA_{1-(p,q)}$ of the first sub-pixel 49R based on the pixel signal value $X_{1-(p,q)}$ of the first sub-pixel 49R in the pixel $48_{(p,q)}$ and the power consumption adjustment term $G_2(q)$. Similarly, the output signal generating unit 29 calculates the output signal value $XA_{2-(p,q)}$ of the second sub-pixel 49G based on the pixel signal value $X_{2-(p,q)}$ of the second sub-pixel 49G in the pixel $48_{(p,q)}$ and the power consumption adjustment term $G_2(q)$. Similarly, the output signal generating unit 29 calculates the output signal value $XA_{3-(p,q)}$ of the third sub-pixel 49B based on the pixel signal value $X_{3-(p,q)}$ of the third sub-pixel 49B in the pixel $48_{(p,q)}$ and the power consumption adjustment term $G_2(q)$. Similarly, the output signal generating unit 29 calculates the output signal value $XA_{4-(p,q)}$ of the fourth sub-pixel 49W based on the pixel signal value $X_{4-(p,q)}$ of the fourth sub-pixel 49W in the pixel $48_{(p,q)}$ and the power consumption adjustment term $G_2(q)$.

Specifically, as represented by the following formula (15) to formula (18), the output signal generating unit 29 calculates the output signal values for the pixel $48_{(p,q)}$ based on the value of the product of the pixel signal value of the pixel $48_{(p,q)}$ and the power consumption adjustment term $G_2(q)$.

$$XA_{1-(p,q)}=G_2(q)\cdot X_{1-(p,q)} \tag{15}$$

$$XA_{2-(p,q)}=G_2(q)\cdot X_{2-(p,q)} \tag{16}$$

$$XA_{3-(p,q)}=G_2(q)\cdot X_{3-(p,q)} \tag{17}$$

$$XA_{4-(p,q)}=G_2(q)\cdot X_{4-(p,q)} \tag{18}$$

The output signal generating unit 29 calculates the output signal values as described above and outputs an output signal having the output signal values to the image display panel drive unit 30. The output signal generating unit 29 outputs the calculated output signal values for all the pixels 48 within the line pixel group 46 (the respective pixels 48 of the qth row) to the frame integrating unit 25. When performing processing with the next (the (q+1)th) pixel row newly as the line pixel group 46, the frame integrating unit 25 adds all the output signal values of the respective pixels 48 of the qth row to the frame integrated value $M(q)$ to calculate a frame integrated value $M(q+1)$. When the frame integrated value $M(q)$ is a value of the frame threshold A or larger, the output signal generating unit 29 may set the values of the output signal values $XA_{1-(p,q)}$, $XA_{2-(p,q)}$, $XA_{3-(p,q)}$, and $XA_{4-(p,q)}$ to zero.

Figure 11:
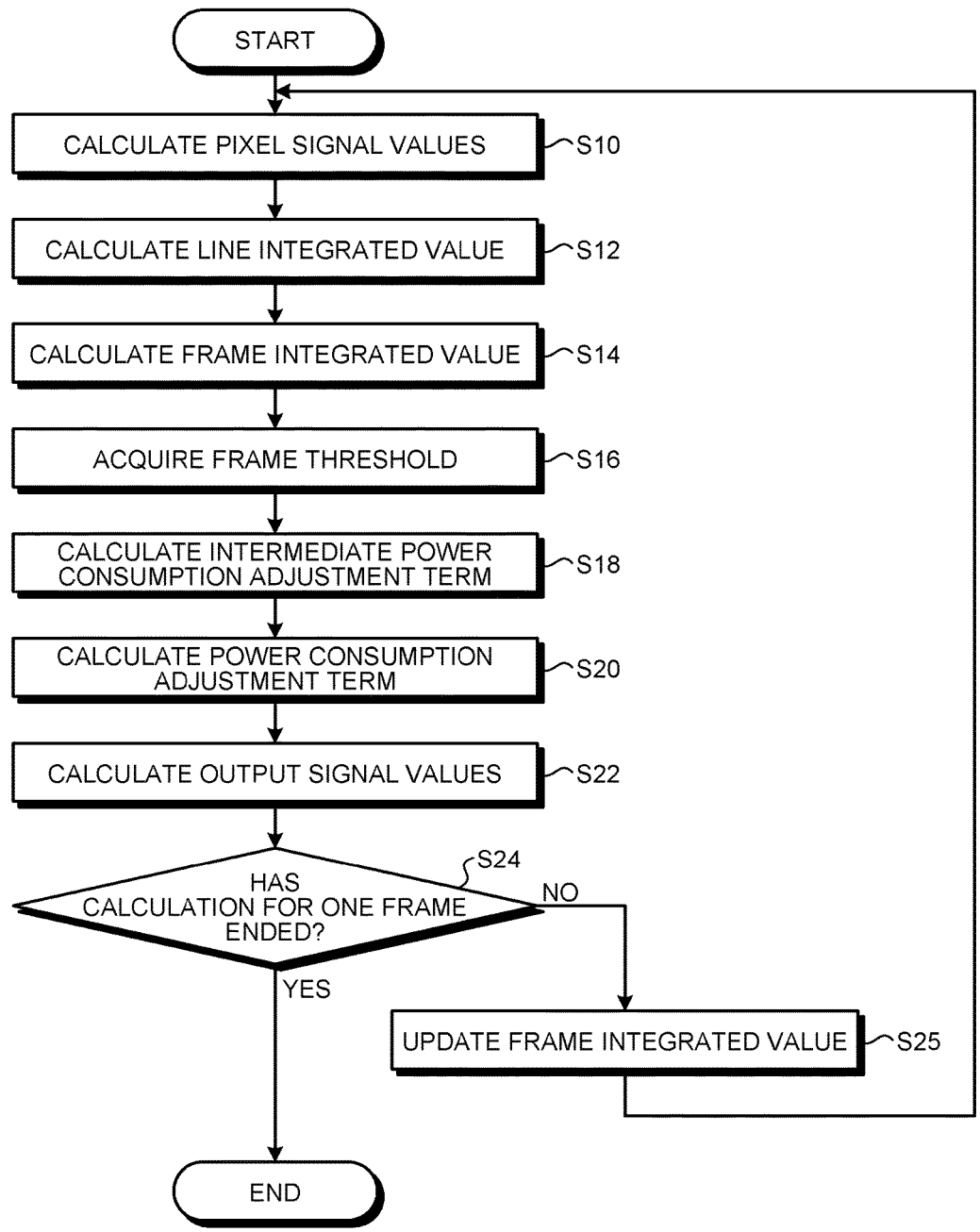
FIG. 11 is a flowchart for illustrating a processing procedure of a controller according to the first embodiment.

The following describes a processing procedure of the controller 20 as the summary of the processing of the controller 20 described above based on a flowchart. FIG. 11 is a flowchart for illustrating the processing procedure of the controller according to the first embodiment. As illustrated in FIG. 11, the controller 20 calculates the pixel signal values of the respective pixels 48 based on the input signal values of the respective pixels 48 by the pixel signal value calculating unit 21 (Step S10). Specifically, the pixel signal value calculating unit 21 calculates the pixel signal value $X_{1-(p,q)}$ of the first sub-pixel 49R, the pixel signal value $X_{2-(p,q)}$ of the second sub-pixel 49G, the pixel signal value $X_{3-(p,q)}$ of the third sub-pixel 49B, and the pixel signal value $X_{4-(p,q)}$ of the fourth sub-pixel 49W in the pixel $48_{(p,q)}$ based on the formula (3) to the formula (6).

After calculating the pixel signal values, the controller 20 calculates the line integrated value $L(q)$ by the line integrating unit 24 (Step S12), calculates the frame integrated value $M(q)$ by the frame integrating unit 25 (Step S14), and acquires the frame threshold A by the frame threshold acquiring unit 26 (Step S16). The controller 20 calculates the line integrated value $L(q)$ by the formula (7) by the line integrating unit 24. The controller 20 calculates the line integrated value $L(q)$ by the formula (8) by the frame integrating unit 25. The mutual processing order of Steps S12, S14, and S16 may be any order so long as the pieces of processing are performed prior to Step S18.

After acquiring the frame threshold A, the controller 20 calculates the intermediate power consumption adjustment term $G_1(q)$ by the intermediate power consumption adjustment term calculating unit 70 (Step S18). The intermediate power consumption adjustment term calculating unit 70 calculates the intermediate power consumption adjustment term $G_1(q)$ based on the formula (10).

After calculating the intermediate power consumption adjustment term $G_1(q)$, the controller 20 calculates the power consumption adjustment term $G_2(q)$ by the power consumption adjustment term calculating unit 72 (Step S20). The power consumption adjustment term calculating unit 72 calculates the power consumption adjustment term $G_2(q)$ based on the formula (11) or the formula (12).

After calculating the power consumption adjustment term $G_2(q)$, the controller 20 calculates the output signal values by the output signal generating unit 29 (Step S22). The output signal generating unit 29 calculates the output signal values based on the value of the product of the pixel signal value and the power consumption adjustment term $G_2(q)$ as represented by the formula (15) to the formula (18).

After calculating the output signal values, the controller 20 determines whether the calculation of the output signal values for one display frame has ended (Step S24). If the calculation of the output signal values for one display frame has not ended (No at Step S24), the controller 20 updates the frame integrated value (Step S25), then returns to Step S10, and performs processing to calculate the output signal values of the respective pixels 48 of the (q+1)th pixel row with the next pixel row (the (q+1)th pixel row in this example) newly as the line pixel group 46. If the calculation of the output signal values for one display frame has ended (Yes at Step S24), the controller 20 ends this calculation processing and starts the processing to calculate the output signal values in the next display frame.

Figure 12:
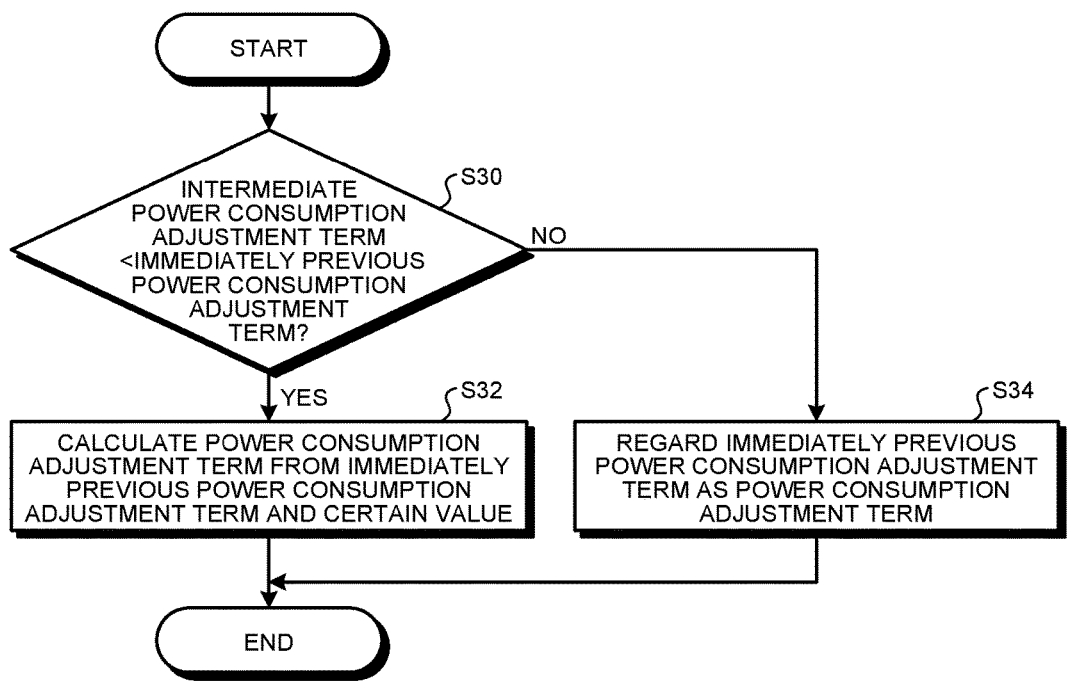
FIG. 12 is a flowchart illustrating a procedure to calculate a power consumption adjustment term.

The following describes a procedure to calculate the power consumption adjustment term $G_2(q)$ at Step S20 by a flowchart. FIG. 12 is a flowchart illustrating the procedure to calculate the power consumption adjustment term. As illustrated in FIG. 12, the power consumption adjustment term calculating unit 72 determines whether the intermediate power consumption adjustment term $G_1(q)$ is smaller than the immediately previous power consumption adjustment term $G_2(q-1)$ (Step S30). If the intermediate power consumption adjustment term $G_1(q)$ is smaller than the immediately previous power consumption adjustment term $G_2(q-1)$ (Yes at Step S30), the power consumption adjustment term calculating unit 72 calculates the power consumption adjustment term $G_2(q)$ based on the immediately previous power consumption adjustment term $G_2(q-1)$ and the predetermined value B (Step S32). If the intermediate power consumption adjustment term $G_1(q)$ is not smaller than the immediately previous power consumption adjustment term $G_2(q-1)$ (No at Step S30), that is, if the intermediate power consumption adjustment term $G_1(q)$ is a value of the immediately previous power consumption adjustment term $G_2(q-1)$ or larger, the power consumption adjustment term calculating unit 72 regards the immediately previous power consumption adjustment term $G_2(q-1)$ as the power consumption adjustment term $G_2(q)$ (Step S34). The processing at this Step S32 or Step S34 ends the procedure to calculate the power consumption adjustment term $G_2(q)$.

As described above, the controller 20 calculates the output signal values to the respective pixels 48 for each row (for each pixel row) along the Y direction based on the pixel signal values to the pixels 48 for the image display panel 40 that displays an image for each display frame. The controller 20 includes the line integrating unit 24, the frame integrating unit 25, the power consumption adjustment term determining unit 28, and the output signal generating unit 29. The line integrating unit 24 calculates the line integrated value $L(q)$ by totaling the pixel signal values for the respective pixels 48 within the line pixel group 46. The line pixel group 46 is a plurality of pixels 48 arranged in one row. The frame integrating unit 25 calculates the frame integrated value $M(q)$ by totaling the output signal values for the respective pixels 48 of the former arranged pixel group 47. The power consumption adjustment term determining unit 28 calculates the power consumption adjustment term $G_2(q)$ common to the respective pixels within the line pixel group 46 based on the frame threshold A, which is the predetermined threshold for power consumption in the display frame, the line integrated value $L(q)$, and the frame integrated value $M(q)$. The output signal generating unit 29 calculates the output signal values for the pixel $48_{(p,q)}$ based on the pixel signal values to the pixel $48_{(p,q)}$ within the line pixel group 46 and the power consumption adjustment term $G_2(q)$.

Example of Display by Present Processing

In self-light-emitting pixels generally, an output signal value (the luminance of the pixel) and the amount of power consumption by lighting are proportional to each other. Consequently, the self-light-emitting pixels can reduce power consumption by reducing the output signal value. When reducing the output signal values in the display frame to be displayed, there is a case where the reduction amount of the output signal values is determined based on the amount of power consumption and/or the output signal values of the display frame previously displayed. However, in this case, when an image difference between the previous display frame and the display frame to be displayed is large, the reduction amount of the output signal values is not necessarily able to be determined appropriately. When the luminance of an image of a display frame is small and the output signal values are small, the output signal values are not necessarily reduced in the display frame because the amount of power consumption is small, for example. When the luminance of an image to be displayed in the next display frame is large, the output signal values are not able to be reduced appropriately based on the reduction amount of the previous display frame, even when the output signal values are required to be reduced for power consumption reduction. It is because the output signal values are not reduced in the previous frame. On the other hand, there is a case when the reduction amount of the output signal values in a display frame is large but the reduction in the output signal values is not required in the next display frame. In this case, the output signal values are reduce more than necessary in the next display frame, therefore image quality may degrade such that the image is extremely dark. When being based on the reduction in the display frame previously displayed, all the output signal values in the previous display frame are required to be stored, which may increase the scale of the device.

In contrast, the controller 20 (the control device) according to the present embodiment determines the output signal values by referring to the data of its own display frame without being based on the reduction amount in the output signal values in the previous display frame. Specifically, the controller 20 determines the output signal values for each line (one pixel row), calculates the power consumption adjustment term $G_2(q)$ based on the frame threshold A, the frame integrated value $M(q)$, and the line integrated value $L(q)$. The controller 20 calculates the output signal values based on the power consumption adjustment term $G_2(q)$. The power consumption adjustment term $G_2(q)$ is the coefficient to adjust the amount of power consumption of the pixels 48 by adjusting the pixel signal values of the pixels 48. The frame threshold A is the threshold of power consumption in one display frame. The frame integrated value M(q) is the total of the output signal values so far in the same display frame, which is, in other words, the total value of the amount of power consumption so far in the same display frame. The line integrated value L(q) is the total value of the pixel signal values of the pixel row (the line pixel group 46) for which the output signal values are to be determined, which can be said to be the amount of power consumption when the adjustment is not performed by the power consumption adjustment term $G_2(q)$ in the pixel row. In other words, the controller 20 calculates the output signal values based on the threshold of the amount of power consumption in one display frame, the total of the amount of power consumption so far in the same display frame, and the amount of power consumption when the adjustment of the pixel row for which the output signal values are to be calculated is not performed. The controller 20 thus calculates the output signal by referring to the various kinds of information in its own frame without being based on the reduction amount in the respective output signal values of the previous display frame and can thereby appropriately reduce power consumption while reducing the degradation of image quality.

Figure 13:
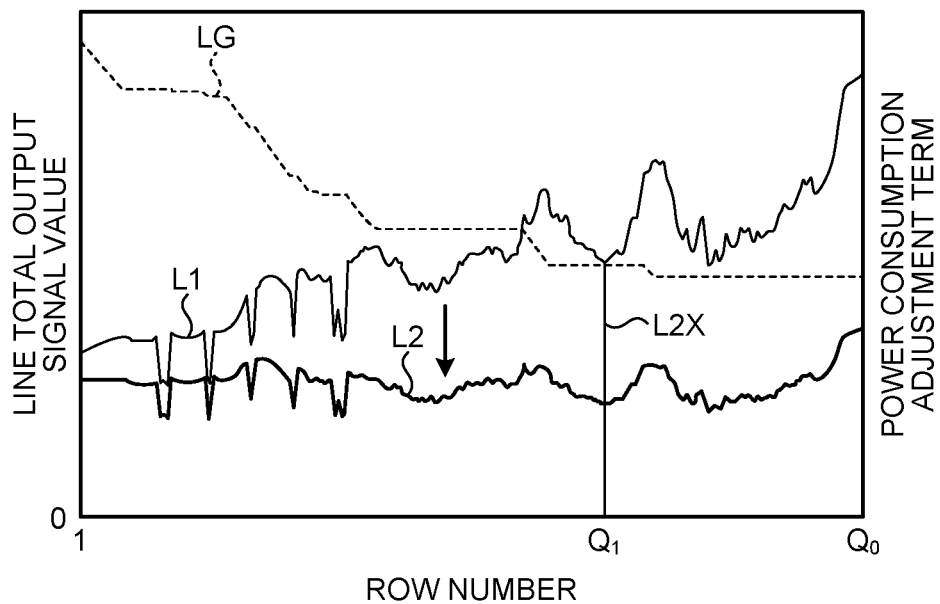
FIG. 13 is a graph of a line total output signal value for each pixel row.
Figure 14:
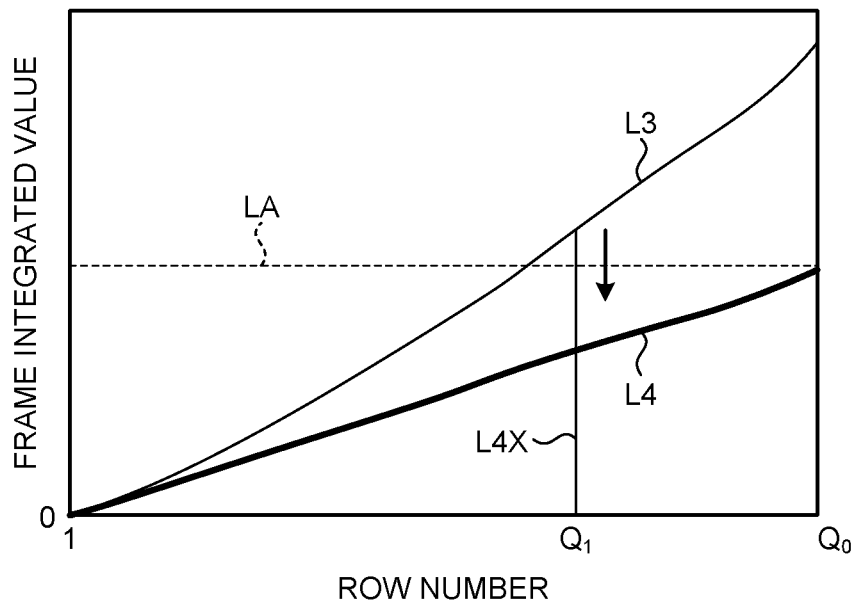
FIG. 14 is a graph of a frame integrated value for each pixel row.

The following describes a calculation example of the output signal values when the processing by the controller 20 according to the first embodiment is performed. FIG. 13 is a graph of a line total output signal value for each pixel row. FIG. 14 is a graph of a frame integrated value for each pixel row. The horizontal axis of FIG. 13 indicates the row number of each pixel row. The left side of the vertical axis of FIG. 13 indicates a line total output signal value, which is the total of the output signal values of the respective sub-pixels 49 in one pixel row. The right side of the vertical axis of FIG. 13 indicates the value of the power consumption adjustment term in each pixel row. The line segment LG in FIG. 13 is a line segment corresponding to the right side of the vertical axis of FIG. 13 and indicates a power consumption adjustment value in each pixel row. The line segment L1 in FIG. 13 is a line segment corresponding to the left side of the vertical axis of FIG. 13. The line segment L1 indicates the line total output signal value of each pixel row when no processing is performed on the pixel signal values and the pixel signal values are output as the output signal values as they are. The line segment L2 in FIG. 13 is a line segment corresponding to the left side of the vertical axis of FIG. 13. The line segment L2 indicates the line total output signal value of each pixel row when the processing by the controller 20 is performed. The line segment L2X in FIG. 13 is a line segment corresponding to the left side of the vertical axis of FIG. 13. The line segment L2X indicates the line total output signal value of each pixel row when processing by a controller 20X according to a comparative example described below is performed.

The self-light-emitting pixels have influence such as a shortened life with an extremely large amount of power consumption, and the upper limit of the amount of power consumption for each display frame may be determined. The controller 20X according to the comparative example performs no processing on the pixel signal values until the upper limit of the amount of power consumption reaches and regards the pixel signal values as the output signal values as they are. However, when the amount of power consumption integrated over one display frame, that is, the frame integrated value reaches the upper limit of the amount of power consumption, the controller 20X according to the comparative example performs processing to make the output signal values zero for the pixels 48 of the subsequent pixel rows, thereby not consuming electric power further. In other words, in the example in FIG. 13, in the controller 20X of the comparative example as indicated by the line segment L2X, the frame integrated value does not reach the upper limit of the amount of power consumption from the first row to the $Q_1$th row, and the line total output signal value is the same as the line segment L1. However, in the $Q_1$th row and later, the frame integrated value has reached the upper limit of the amount of power consumption, and the line total output signal value becomes zero. The line total output signal value becoming zero makes the output signal values zero, which makes the $Q_1$th row and later black display. In the example in FIG. 13, the controller 20X according to the comparative example may have the risk of increased differences in the output signal values among the pixel rows.

In contrast, the controller 20 according to the first embodiment adjusts the output signal values from the first row using the power consumption adjustment term as indicated by the line segment LG. Consequently, in the example in FIG. 13, as indicated by the line segment L2, the controller 20 according to the first embodiment does not make the output signal values zero in the $Q_1$th row and later, which does not make the $Q_1$th row and later black display. In the example in FIG. 13, the controller 20 thus prevents differences in the output signal values among the pixel rows from increasing.

FIG. 14 is a graph obtained by integrating the line total output signal value in FIG. 13. The horizontal axis of FIG. 14 indicates the row number of each pixel row. The vertical axis of FIG. 14 indicates a frame integrated value up to the pixel row, that is, the integrated value of the line total output signal value. The line segment LA in FIG. 14 indicates the frame threshold A. The line segment L3 in FIG. 14 corresponds to the line segment L1 in FIG. 13. The line segment L3 indicates the frame integrated value of each pixel row when no processing is performed on the pixel signal values and the pixel signal values are output as the output signal values as they are. The line segment L4 in FIG. 14 corresponds to the line segment L2 in FIG. 13. The line segment L4 indicates the frame integrated value of each pixel row when the processing by the controller 20 is performed. The line segment L4X in FIG. 14 corresponds to the line segment L2X in FIG. 13. The line segment L4X indicates the frame integrated value of each pixel row when the processing by the controller 20X according to the comparative example is performed.

As illustrated in the example in FIG. 14, in the controller 20X according to the comparative example, the frame integrated value reaches the frame threshold A in the $Q_1$th row, the subsequent output signal values are zero, and the frame integrated value remains at the frame threshold A. In contrast, with the controller 20 according to the first embodiment in the example in FIG. 14, the output signal values are adjusted from the first row, the output signal values are not zero even in the $Q_1$th row and later, and a change in the rate of increase of the frame integrated value is smaller than that with the controller 20X according to the comparative example.

Figure 15:
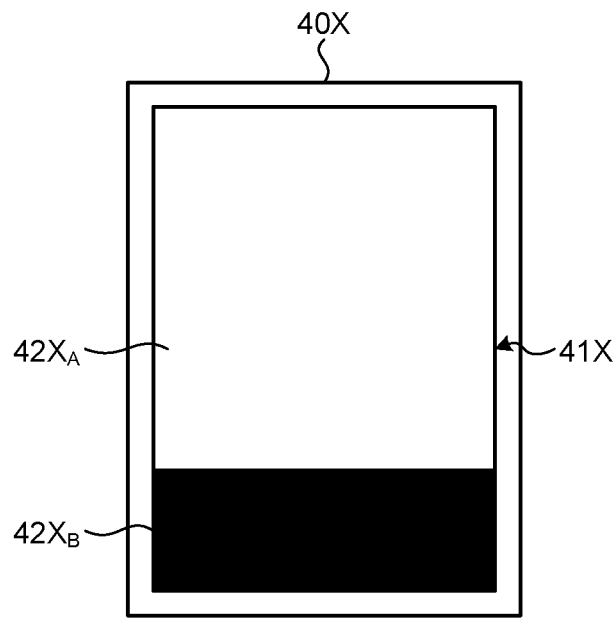
FIG. 15 illustrates an example of the display of an image according to a comparative example.
Figure 16:
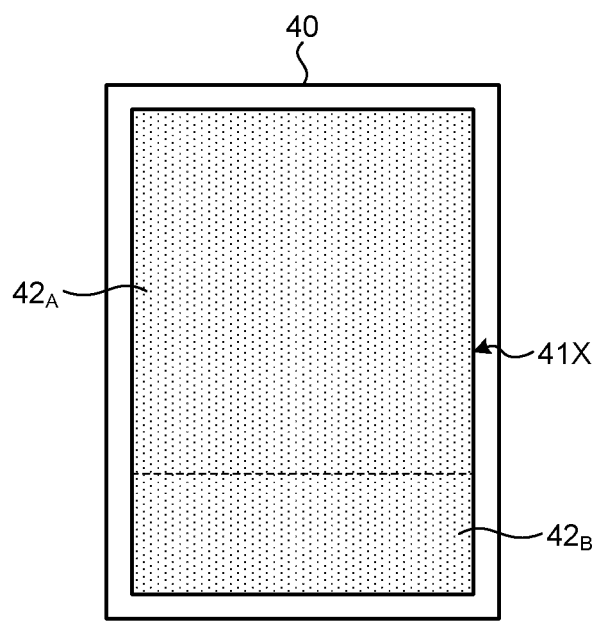
FIG. 16 illustrates an example of the display of an image according to the first embodiment.

FIG. 15 illustrates an example of the display of an image according to the comparative example. FIG. 16 illustrates an example of the display of an image according to the first embodiment. FIG. 15 illustrates an example of an image that the controller 20X according to the comparative example displays in the examples in FIG. 13 and FIG. 14. FIG. 16 illustrates an example of an image that the controller 20 according to the first embodiment displays in the examples in FIG. 13 and FIG. 14. As illustrated in FIG. 15, a display unit 41X of an image display panel 40X according to the comparative example displays an image $42X_A$ and an image $42X_B$. The image $42X_A$ is an image that the first to the $Q_1$th pixel rows display, whereas the image $42X_B$ is an image that the $Q_1$th and later pixel rows display. The image $42X_A$ displays the output signal values as the output signal values as they are, whereas the image $42X_B$ is zero in the output signal values. Consequently, the image $42X_B$ is black display, and an image luminance difference between the image $42X_A$ and the image $42X_B$ is large. As a consequence, in the examples described in FIG. 13 to FIG. 15, the controller 20X according to the comparative example may increase the luminance difference of the display image in one frame and may make the deterioration of image quality likely to be visually recognized when power consumption is reduced.

In contrast, as illustrated in FIG. 16, the display unit 41 of the image display panel 40 according to the first embodiment displays an image $42_A$ and an image $42_B$. The image $42_A$ is an image that the first to the $Q_1$th pixel rows display, whereas the image $42_B$ is an image that the $Q_1$th and later pixel rows display. In the example in FIG. 16, the output signal values do not become zero even in the $Q_1$th row and later, and the luminance difference between the image $42_A$ and the image $42_B$ is prevented from increasing. The controller 20 according to the first embodiment can thus prevent the luminance difference of the display image in one frame from increasing while reducing power consumption.

More specifically, the power consumption adjustment term determining unit 28 according to the present embodiment includes the intermediate power consumption adjustment term calculating unit 70. The intermediate power consumption adjustment term calculating unit 70 calculates the intermediate power consumption adjustment term $G_1(q)$ for calculating the power consumption adjustment term $G_2(q)$. The intermediate power consumption adjustment term calculating unit 70 calculates the difference value $U(q)$ obtained by subtracting the frame integrated value $M(q)$ from the frame threshold A. The intermediate power consumption adjustment term calculating unit 70 calculates the intermediate power consumption adjustment term $G_1(q)$ so that the value of the product of the line integrated value $L(q)$ and the intermediate power consumption adjustment term $G_1(q)$ will not exceed the difference value $U(q)$. The difference value $U(q)$ can be said to be the allowance margin of the amount of power consumption (the magnitude of the output signal values) that the line pixel group 46 can consume. In addition, as described above, the line integrated value $L(q)$ can be said to be the amount of power consumption when the adjustment is not performed by the power consumption adjustment term $G_2(q)$ in the line pixel group 46. The controller 20 causes the value of the product of the intermediate power consumption adjustment term $G_1(q)$ and the line integrated value $L(q)$ not to exceed the difference value $U(q)$, which is the allowance margin. Consequently, the controller 20 can prevent the amount of power consumption for each pixel row from exceeding the allowance margin. For this reason, the controller 20 can prevent the degradation of images more appropriately while reducing power consumption.

The intermediate power consumption adjustment term calculating unit 70 calculates the total of the number of rows (q, for example) in the Y direction of the line pixel group 46 and the former arranged pixel group 47. The intermediate power consumption adjustment term calculating unit 70 calculates the intermediate power consumption adjustment term $G_1(q)$ so that the value of the product of the line integrated value $L(q)$ and the intermediate power consumption adjustment term $G_1(q)$ will not exceed the value obtained by dividing the difference value $U(q)$ by the total of the number of rows (q, for example). The value obtained by dividing the difference value $U(q)$ by the total of the number of rows (q, for example) can be said to be the allowance margin of the power consumption of each pixel row. This controller 20 causes the value of the product of the intermediate power consumption adjustment term $G_1(q)$ and the line integrated value $L(q)$ not to exceed the allowance margin of the power consumption of each pixel row. Consequently, in this case, the controller 20 can prevent variations in the output signal value (the luminance) among the pixel rows. For this reason, the controller 20 can prevent the degradation of images more appropriately while reducing power consumption.

The power consumption adjustment term determining unit 28 according to the present embodiment further includes the power consumption adjustment term calculating unit 72. The power consumption adjustment term calculating unit 72 compares the immediately previous power consumption adjustment term $G_2(q-1)$, which is a power consumption adjustment term in the line pixel group 46 for which the output signal values have been calculated immediately before, and the intermediate power consumption adjustment term $G_1(q)$ to calculate the power consumption adjustment term $G_2(q)$. This power consumption adjustment term calculating unit 72 compares the immediately previous power consumption adjustment term $G_2(q-1)$ and the intermediate power consumption adjustment term $G_1(q)$ to calculate the power consumption adjustment term $G_2(q)$. Therefore it can reduce variations in the output signal value (the luminance) among the pixel rows. For this reason, the controller 20 can prevent the degradation of images more appropriately while reducing power consumption.

If the intermediate power consumption adjustment term $G_1(q)$ is smaller than the immediately previous power consumption adjustment term $G_2(q-1)$, the power consumption adjustment term calculating unit 72 determines a value obtained by subtracting the predetermined value B from the immediately previous power consumption adjustment term $G_2(q-1)$ to be the power consumption adjustment term $G_2(q)$. The power consumption adjustment term calculating unit 72 can reduce the value of the power consumption adjustment term $G_2(q)$ by subtracting the determined constant value from the immediately previous power consumption adjustment term $G_2(q-1)$. Therefore it can reduce variations in the output signal value (the luminance) among the pixel rows.

The predetermined value B is set based on the total of the number of rows ($Q_0$ in this example) in the Y direction of all the pixels 48 in the display frame. As the predetermined value B is set based on the total of the number of rows, the power consumption adjustment term calculating unit 72 can reduce the value of the power consumption adjustment term $G_2(q)$ more uniformly based on the total of the number of rows. Consequently, the power consumption adjustment term calculating unit 72 can favorably reduce variations in the output signal value (the luminance) among the pixel rows.

If the intermediate power consumption adjustment term $G_1(q)$ is a value of the immediately previous power consumption adjustment term $G_2(q-1)$ or larger, the power consumption adjustment term calculating unit 72 makes the power consumption adjustment term $G_2(q)$ the same value as the immediately previous power consumption adjustment term $G_2(q-1)$. The power consumption adjustment term calculating unit 72 prevents the power consumption adjustment term $G_2(q)$ from exceeding the immediately previous power consumption adjustment term $G_2(q-1)$, and the power consumption adjustment term calculating unit 72 can favorably reduce variations in the output signal value (the luminance) among the pixel rows.

The method for calculating the power consumption adjustment term $G_2(q)$ is not limited to the method by the comparison between the immediately previous power consumption adjustment term $G_2(q-1)$ and the intermediate power consumption adjustment term $G_1(q)$ as described above. The intermediate power consumption adjustment term $G_1(q)$ may be regarded as the power consumption adjustment term $G_2(q)$ as it is, for example.

The output signal generating unit 29 calculates the output signal values for the respective pixels 48 (the pixel $48_{(p,q)}$, for example) of the line pixel group 46 based on the value of the product of the pixel signal value to its own pixel 48 (the pixel $48_{(p,q)}$, for example) within the line pixel group 46 and the power consumption adjustment term $G_2(q)$. This output signal generating unit 29 calculates the output signal values based on the value of the product of the pixel signal value and the power consumption adjustment term $G_2(q)$ and can thereby appropriately adjust the output signal values to reduce power consumption.

Second Embodiment

The following describes a second embodiment. A display device 10a according to the second embodiment is different from that of the first embodiment in that a pixel 48a does not include the fourth sub-pixel 49W. Descriptions of parts common to the first embodiment in the second embodiment will be omitted.

Figure 17:
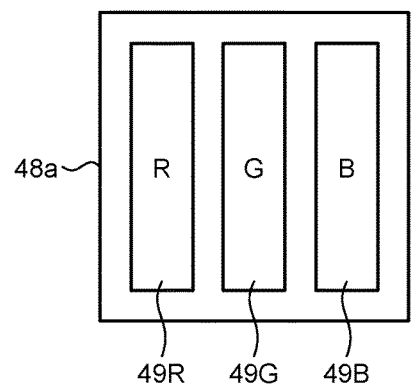
FIG. 17 is a diagram of a sub-pixel arrangement of a pixel according to a second embodiment.

FIG. 17 is a diagram of a sub-pixel arrangement of a pixel according to the second embodiment. As illustrated in FIG. 17, the pixel 48a in the second embodiment arranges the first sub-pixel 49R, the second sub-pixel 49G, and the third sub-pixel 49B in a stripe shape in one direction. The pixel 48a does not include the fourth sub-pixel 49W.

The controller 20 in the second embodiment, not including the fourth sub-pixel 49W, does not include the pixel signal value calculating unit 21 that performs the extension processing. The controller 20 in the second embodiment regards the input signal value $x_{1-(p,q)}$ of the first sub-pixel 49R, the input signal value $x_{2-(p,q)}$ of the second sub-pixel 49G, and the input signal value $x_{3-(p,q)}$ of the third sub-pixel 49B as the pixel signal value $X_{1-(p,q)}$ of the first sub-pixel 49R, the pixel signal value $X_{2-(p,q)}$ of the second sub-pixel 49G, and the pixel signal value $X_{3-(p,q)}$ of the third sub-pixel 49B as they are, respectively. The subsequent processing of the controller 20 is similar to that of the first embodiment.

As described in the second embodiment, even when not including the fourth sub-pixel 49W, the controller 20 calculates the output signal values by referring to the various kinds of information in its own frame without being based on the reduction amounts of the respective output signal values of the previous display frame. Therefore it can appropriately reduce power consumption while reducing the degradation of image quality.

Use Examples

Figure 18:
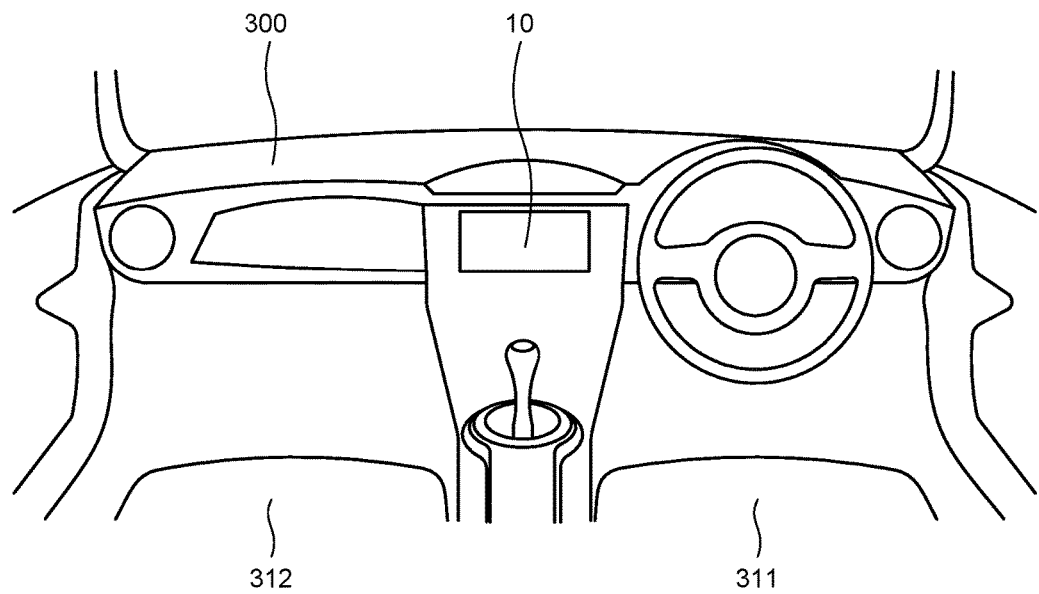
FIG. 18 is a diagram of an example of an electronic apparatus in which the display device according to the first embodiment is used.
Figure 19:
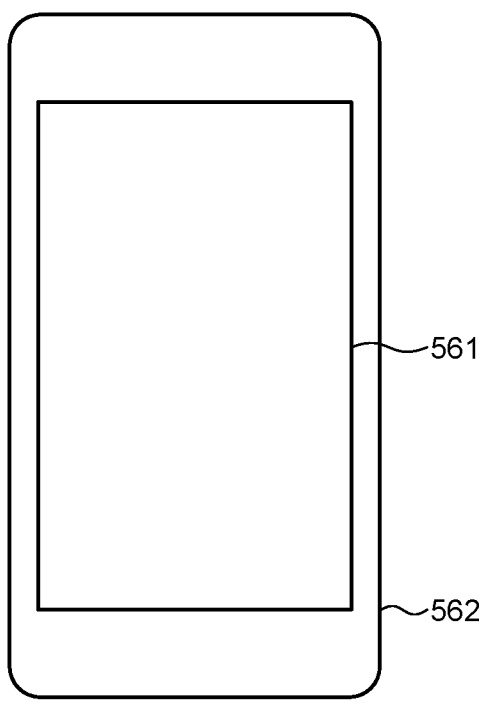
FIG. 19 is a diagram of an example of the electronic apparatus in which the display device according to the first embodiment is used.

The following describes use examples of the display device 10 described in the first embodiment with reference to FIG. 18 and FIG. 19. FIG. 18 and FIG. 19 are diagrams of examples of an electronic apparatus in which the display device according to the first embodiment is used. The display device 10 according to the first embodiment can be used in electronic apparatuses in various fields such as a car navigation system illustrated in FIG. 18, a TV set, a digital camera, a notebook personal computer, a portable electronic apparatus such as a cellular phone illustrated in FIG. 19, and a video camera. In other words, the display device 10 according to the first embodiment can be used in electronic apparatus in various fields that display video signals externally input or video signals internally generated as images or videos. The electronic apparatus includes the input signal output unit 100 (refer to FIG. 1) that supplies a video signal (an input signal) to the display device and controls the operation of the display device. The present use example can also be used in the other embodiment described above or modifications other than the display device 10 according to the first embodiment.

The electronic apparatus illustrated in FIG. 18 is the car navigation device in which the display device 10 according to the first embodiment is used. The display device 10 is installed in a dashboard 300 within a car. Specifically, the display device 10 is installed on the dashboard 300 between a driver's seat 311 and a passenger's seat 312. The display device 10 of the car navigation device is used for navigation display, the display of a music operating screen, movie reproduction display, or the like.

The electronic apparatus illustrated in FIG. 19 operates as a portable computer, a multifunctional cellular phone, a portable computer capable of voice communication, or a portable computer capable of communication in which the display device 10 according to the first embodiment is used and is a portable information terminal that may be called what is called a smartphone or a tablet terminal. This potable information terminal includes a display unit 561 on the surface of a housing 562, for example. This display unit 561 includes the display device 10 according to the first embodiment and a touch detection (what is called a touch panel) function that can detect external proximity objects.

The present disclosure can employ the following configurations.

(1) A control device for an image display panel, wherein the image display panel has pixels arranged in a two-dimensional matrix manner in a row direction and a column direction, wherein the pixels display colors in accordance with lighting amounts of self-light-emitting bodies, wherein the image display panel displays an image for each display frame, wherein the control device calculates output signal value to the respective pixels for each row in the column direction based on pixel signal values for causing the pixels to display certain colors, the control device comprising:

a line integrating unit that calculate a line integrated value by totaling the pixel signal values for the respective pixels within a line pixel group, the line pixel group including a plurality of pixels arranged in a row in the row direction;

a frame integrating unit that calculates a frame integrated value by totaling the output signal values for the respective pixels of a former arranged pixel group, the former arranged pixel group including a plurality of pixels that are arranged in rows other than the line pixel group and for which the output signal values have already been calculated in the same display frame;

a power consumption adjustment term determining unit that calculates a power consumption adjustment term common to the respective pixels within the line pixel group based on a frame threshold that is a predetermined threshold for power consumption in the display frame, the line integrated value, and the frame integrated value; and an output signal generating unit that calculates output signal values for the respective pixels of the line pixel group based on a pixel signal value to its own pixel within the line pixel group and the power consumption adjustment term.

(2) The control device, wherein
the power consumption adjustment term determining unit includes an intermediate power consumption adjustment term calculating unit that calculates an intermediate power consumption adjustment term for calculating the power consumption adjustment term, and
the intermediate power consumption adjustment term calculating unit calculates a difference value obtained by subtracting the frame integrated value from the frame threshold and calculates the intermediate power consumption adjustment term so that a value of a product of the line integrated value and the intermediate power consumption adjustment term does not exceed the difference value.

(3) The control device, wherein the intermediate power consumption adjustment term calculating unit calculates a total of the number of rows in the column direction of the line pixel group and the former arranged pixel group and calculates the intermediate power consumption adjustment term so that the value of the product of the line integrated value and the intermediate power consumption adjustment term does not exceed a value obtained by dividing the difference value by the total of the number of rows.

(4) The control device, wherein the power consumption adjustment term determining unit includes a power consumption adjustment term calculating unit that calculates the power consumption adjustment term by comparing an immediately previous power consumption adjustment term that is a power consumption adjustment term in a line pixel group for which the output signal values have been calculated immediately before, and the intermediate power consumption adjustment term.

(5) The control device, wherein when the intermediate power consumption adjustment term is smaller than the immediately previous power consumption adjustment term, the power consumption adjustment term calculating unit determines a value obtained by subtracting a predetermined value from the immediately previous power consumption adjustment term to be the power consumption adjustment term.

(6) The control device, wherein the predetermined value is set based on a total of the number of rows in the column direction of all the pixels in the display frame.

(7) The control, wherein when the intermediate power consumption adjustment term is a value of the immediately previous power consumption adjustment term or larger, the power consumption adjustment term calculating unit makes the power consumption adjustment term the same value as the immediately previous power consumption adjustment term.

(8) The control device, wherein the output signal generating unit calculates output signal values for the respective pixels of the line pixel group based on a value of a product of a pixel signal value to its own pixel within the line pixel group and the power consumption adjustment term.

(9) The control device, wherein
the pixel comprises a first sub-pixel displaying a first color, a second sub-pixel displaying a second color, a third sub-pixel displaying a third color, and a fourth sub-pixel displaying a fourth color,
the control device further comprising a pixel signal calculating unit that calculates a pixel signal value of the first sub-pixel, a pixel signal value of the second sub-pixel, a pixel signal value of the third sub-pixel, and a pixel signal value of the fourth sub-pixel based on input signal values of the first sub-pixel, the second sub-pixel, and the third sub-pixel, wherein the pixel signal calculating unit
determines the pixel signal value of the fourth sub-pixel of each pixel based on the input signal value of the first sub-pixel, the input signal value of the second sub-pixel, and the input signal value of the third sub-pixel,
determines the pixel signal value of the first sub-pixel of each pixel based on the input signal value of the first sub-pixel and the pixel signal value of the fourth sub-pixel,
determines the pixel signal value of the second sub-pixel of each pixel based on the input signal value of the second sub-pixel and the pixel signal value of the fourth sub-pixel, and
determines the pixel signal value of the third sub-pixel of each pixel based on the input signal value of the third sub-pixel and the pixel signal value of the fourth sub-pixel.

(10) A display device comprising:
an image display panel, wherein the image display panel has pixels arranged in a two-dimensional matrix manner in a row direction and a column direction, wherein the pixels display colors in accordance with lighting amounts of self-light-emitting bodies, wherein the image display panel displays an image for each display frame, and
a controller that calculates output signal values to the respective pixels for each row in the column direction based on pixel signal values for causing the pixels to display certain colors,
the controller comprising:
a line integrating unit that calculate a line integrated value by totaling the pixel signal values for the respective pixels within a line pixel group, the line pixel group including a plurality of pixels arranged in a row in the row direction;
a frame integrating unit that calculates a frame integrated value by totaling the output signal values for the respective pixels of a former arranged pixel group, the former arranged pixel group including a plurality of pixels that are arranged in rows other than the line pixel group and for which the output signal values have already been calculated in the same display frame;
a power consumption adjustment term determining unit that calculates a power consumption adjustment term common to the respective pixels within the line pixel group based on a frame threshold that is a predetermined threshold for power consumption in the display frame, the line integrated value, and the frame integrated value; and
an output signal generating unit that calculates output signal values for the respective pixels of the line pixel group based on a pixel signal value to its own pixel within the line pixel group and the power consumption adjustment term.

Although the embodiments of the present invention have been described above, the details of these embodiments do not limit these embodiments. The above components include components that those skilled in the art can readily envision, substantially the same components, and components in the range of what is called equivalence. Further, the above components can be combined as appropriate. Still further, various omissions, replacements, or alterations of the components can be made without departing from the essence of the embodiments.

What is claimed is:
1. A control device for an image display panel,
wherein the image display panel has pixels arranged in a two-dimensional matrix manner in a row direction and a column direction,
wherein the pixels display colors in accordance with lighting amounts of self-light-emitting bodies,
wherein the image display panel displays an image for each display frame,
wherein the control device calculates output signal value to the respective pixels for each row in the column direction based on pixel signal values for causing the pixels to display certain colors, the control device comprising:

a line integrating unit that calculate a line integrated value by totaling the pixel signal values for the respective pixels within a line pixel group, the line pixel group including a plurality of pixels arranged in a row in the row direction;

a frame integrating unit that calculates a frame integrated value by totaling the output signal values for the respective pixels of a former arranged pixel group, the former arranged pixel group including a plurality of pixels that are arranged in rows other than the line pixel group and for which the output signal values have already been calculated in the same display frame;

a power consumption adjustment term determining unit that calculates a power consumption adjustment term common to the respective pixels within the line pixel group based on a frame threshold that is a predetermined threshold for power consumption in the display frame, the line integrated value, and the frame integrated value; and an output signal generating unit that calculates output signal values for the respective pixels of the line pixel group based on a pixel signal value to its own pixel within the line pixel group and the power consumption adjustment term.

2. The control device according to claim 1, wherein
the power consumption adjustment term determining unit includes an intermediate power consumption adjustment term calculating unit that calculates an intermediate power consumption adjustment term for calculating the power consumption adjustment term, and
the intermediate power consumption adjustment term calculating unit calculates a difference value obtained by subtracting the frame integrated value from the frame threshold and calculates the intermediate power consumption adjustment term so that a value of a product of the line integrated value and the intermediate power consumption adjustment term does not exceed the difference value.

3. The control device according to claim 2, wherein the intermediate power consumption adjustment term calculating unit calculates a total of the number of rows in the column direction of the line pixel group and the former arranged pixel group and calculates the intermediate power consumption adjustment term so that the value of the product of the line integrated value and the intermediate power consumption adjustment term does not exceed a value obtained by dividing the difference value by the total of the number of rows.

4. The control device according to claim 3, wherein the power consumption adjustment term determining unit includes a power consumption adjustment term calculating unit that calculates the power consumption adjustment term by comparing an immediately previous power consumption adjustment term that is a power consumption adjustment term in a line pixel group for which the output signal values have been calculated immediately before, and the intermediate power consumption adjustment term.

5. The control device according to claim 4, wherein when the intermediate power consumption adjustment term is smaller than the immediately previous power consumption adjustment term, the power consumption adjustment term calculating unit determines a value obtained by subtracting a predetermined value from the immediately previous power consumption adjustment term to be the power consumption adjustment term.

6. The control device according to claim 5, wherein the predetermined value is set based on a total of the number of rows in the column direction of all the pixels in the display frame.

7. The control device according to claim 4, wherein when the intermediate power consumption adjustment term is a value of the immediately previous power consumption adjustment term or larger, the power consumption adjustment term calculating unit makes the power consumption adjustment term the same value as the immediately previous power consumption adjustment term.

8. The control device according to claim 1, wherein the output signal generating unit calculates output signal values for the respective pixels of the line pixel group based on a value of a product of a pixel signal value to its own pixel within the line pixel group and the power consumption adjustment term.

9. The control device according to claim 1, wherein
the pixel comprises a first sub-pixel displaying a first color, a second sub-pixel displaying a second color, a third sub-pixel displaying a third color, and a fourth sub-pixel displaying a fourth color,
the control device further comprising a pixel signal calculating unit that calculates a pixel signal value of the first sub-pixel, a pixel signal value of the second sub-pixel, a pixel signal value of the third sub-pixel, and a pixel signal value of the fourth sub-pixel based on input signal values of the first sub-pixel, the second sub-pixel, and the third sub-pixel, wherein
the pixel signal calculating unit
determines the pixel signal value of the fourth sub-pixel of each pixel based on the input signal value of the first sub-pixel, the input signal value of the second sub-pixel, and the input signal value of the third sub-pixel,
determines the pixel signal value of the first sub-pixel of each pixel based on the input signal value of the first sub-pixel and the pixel signal value of the fourth sub-pixel,
determines the pixel signal value of the second sub-pixel of each pixel based on the input signal value of the second sub-pixel and the pixel signal value of the fourth sub-pixel, and
determines the pixel signal value of the third sub-pixel of each pixel based on the input signal value of the third sub-pixel and the pixel signal value of the fourth sub-pixel.

10. A display device comprising:
an image display panel, wherein the image display panel has pixels arranged in a two-dimensional matrix manner in a row direction and a column direction, wherein the pixels display colors in accordance with lighting amounts of self-light-emitting bodies, wherein the image display panel displays an image for each display frame, and
a controller that calculates output signal values to the respective pixels for each row in the column direction based on pixel signal values for causing the pixels to display certain colors,
the controller comprising:
a line integrating unit that calculate a line integrated value by totaling the pixel signal values for the respective pixels within a line pixel group, the line pixel group including a plurality of pixels arranged in a row in the row direction;

a frame integrating unit that calculates a frame integrated value by totaling the output signal values for the respective pixels of a former arranged pixel group, the former arranged pixel group including a plurality of pixels that are arranged in rows other than the line pixel group and for which the output signal values have already been calculated in the same display frame;

a power consumption adjustment term determining unit that calculates a power consumption adjustment term common to the respective pixels within the line pixel group based on a frame threshold that is a predetermined threshold for power consumption in the display frame, the line integrated value, and the frame integrated value; and an output signal generating unit that calculates output signal values for the respective pixels of the line pixel group based on a pixel signal value to its own pixel within the line pixel group and the power consumption adjustment term.

* * * * *